(12) United States Patent
Seki et al.

(10) Patent No.: US 6,288,941 B1
(45) Date of Patent: Sep. 11, 2001

(54) ELECTRICALLY ERASABLE SEMICONDUCTOR NON-VOLATILE MEMORY DEVICE HAVING MEMORY CELL ARRAY DIVIDED INTO MEMORY BLOCKS

(75) Inventors: Kouichi Seki, Hino; Toshihiro Tanaka, Hachioij; Hitoshi Kume, Musashino; Takeshi Wada, Akishima; Tadashi Muto, Iruma, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/379,020

(22) Filed: Jan. 27, 1995

Related U.S. Application Data

(63) Continuation of application No. 07/942,028, filed on Sep. 8, 1992, now abandoned, which is a continuation of application No. 07/568,071, filed on Aug. 16, 1990, now abandoned.

(30) Foreign Application Priority Data

Aug. 18, 1989 (JP) .................................................. 1-211301
Sep. 20, 1989 (JP) .................................................. 1-242001

(51) Int. Cl.[7] .................................................. G11C 16/04
(52) U.S. Cl. .................................. 365/185.12; 365/185.12; 365/185.11; 365/185.29
(58) Field of Search .................................. 257/208, 503, 257/690, 692, 786; 365/51, 52, 63, 72, 185.12, 185.11, 185.29

(56) References Cited

U.S. PATENT DOCUMENTS

| | | | |
|---|---|---|---|
| 4,803,529 | * 2/1989 | Masuoka | 365/185 |
| 4,949,308 | * 8/1990 | Araki et al. | 365/230.03 |
| 4,996,571 | * 2/1991 | Kume et al. | 365/218 |
| 5,033,023 | * 7/1991 | Hsia et al. | 365/185 |
| 5,047,981 | * 9/1991 | Gill et al. | 365/218 |
| 5,051,953 | * 9/1991 | Kitazawa et al. | 365/185 |
| 5,065,364 | * 11/1991 | Atwood et al. | 365/218 |
| 5,095,461 | * 3/1992 | Miyakawa et al. | 365/185 |
| 5,097,444 | * 3/1992 | Fong | 365/218 |
| 5,109,361 | * 4/1992 | Yim et al. | 365/230.03 |
| 5,136,546 | * 8/1992 | Fukuda et al. | 365/230.03 |

FOREIGN PATENT DOCUMENTS

| | | | |
|---|---|---|---|
| 0136771 | 4/1985 | (EP) . | |
| 59-107489 | 6/1984 | (JP) . | |
| 64-81253 | * 3/1989 | (JP) | 257/786 |

OTHER PUBLICATIONS

National Semiconductor Memory Data Book, Section 4, "Moseproms,"© 1976 National Semiconductor Corp., pp. 4–1 To 4–16.*

H. Kume, et al, "A Flash Erase Eeprom Cell", Proc. IEDM, Wash., DC; Dec. 1987; pp. 560–563.

V. Kynett, et al, "An Insystem Reprogramable . . . Memory", IEEE J. of SSC; vol. 23, #5; 10/88 pp. 1157–1162.

G. Samachisa, et al, "A 128K Flash Eeprom . . . Tech." ISSCC 87, 2/87 ; pp. 76–77.

G. Verma, et al, "Reliability Performance of . . . Flash Mem.", 1988 IEEE IRPS, Ch. 2508; pp. 158–166.

* cited by examiner

Primary Examiner—A. Zarabian
(74) Attorney, Agent, or Firm—Antonelli, Terry, Stout & Kraus, LLP

(57) ABSTRACT

An electrically erasable semiconductor nonvolatile memory device has an array of memory cells arranged in rows and columns and one or more information erasure signal generating circuits. Each of the memory cells of the memory cell array includes a field-effect transistor element having a control gate connected with a word line conductor extending in a direction of the rows, a floating gate where carriers may be accumulated, a drain connected with a data line conductor extending in the direction of the columns and a source connected with a source conductor. The memory cell array may be divided into a plurality of memory blocks so as to have boundaries in the row direction or in the column direction, with the source conductors arranged in the row direction or in the column direction. Information erasure signals may be supplied to the source conductors or data line conductors with a time delay therebetween.

19 Claims, 25 Drawing Sheets

F I G. 5
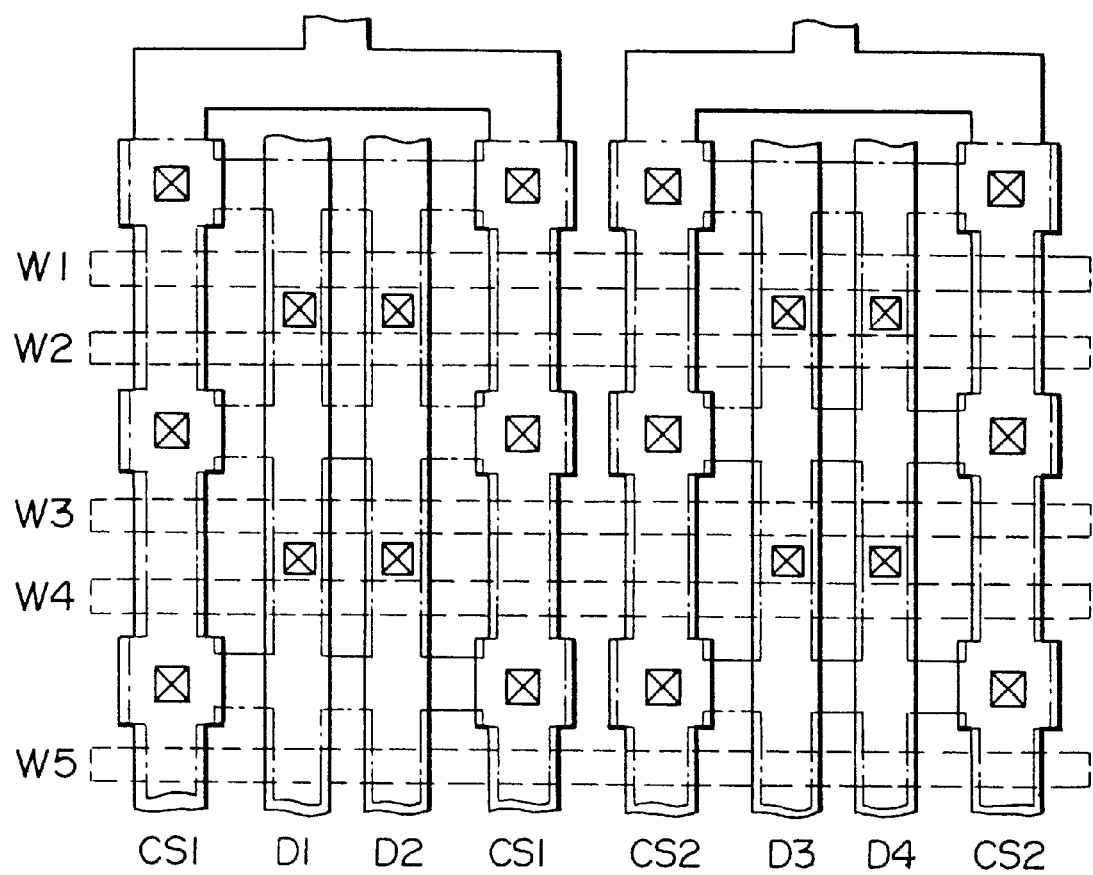

F I G. 7
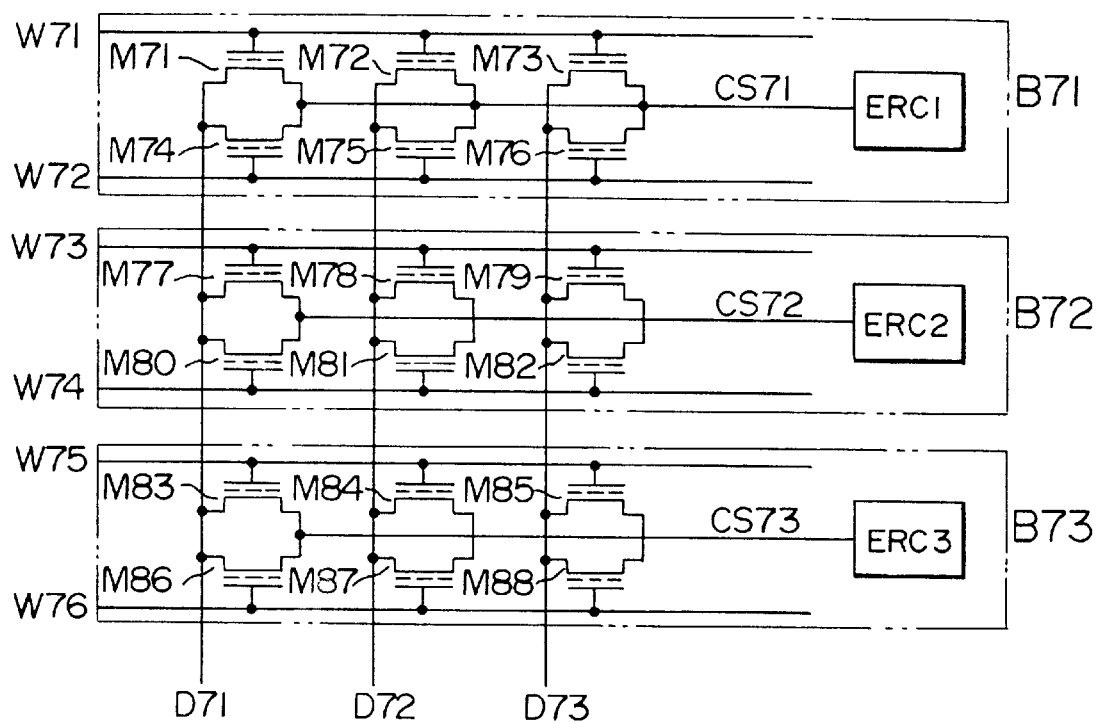

F I G. 13
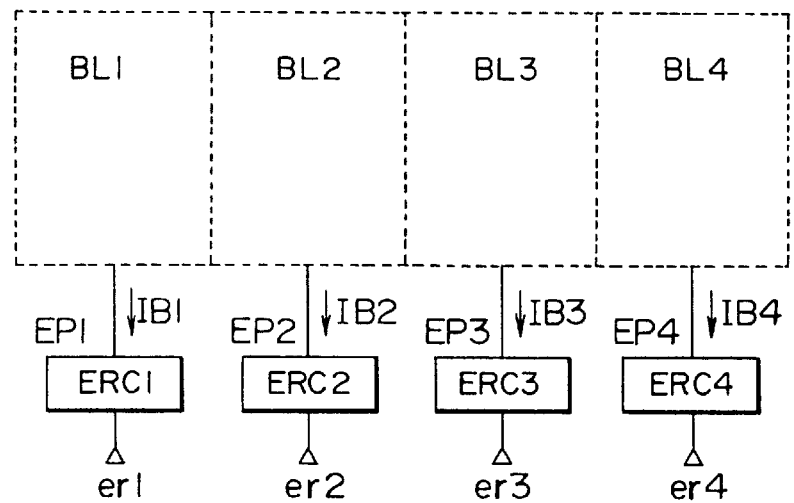
F I G. 14
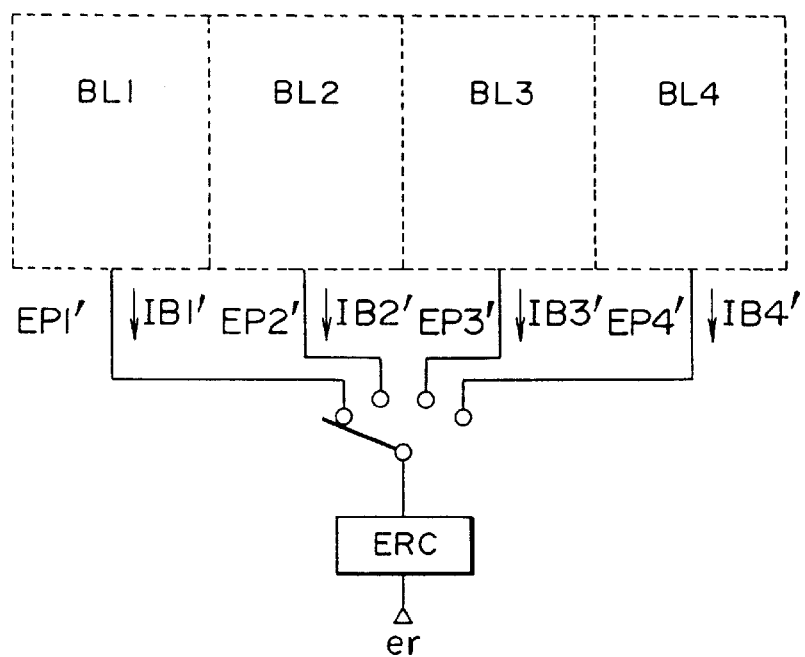

F I G. 15
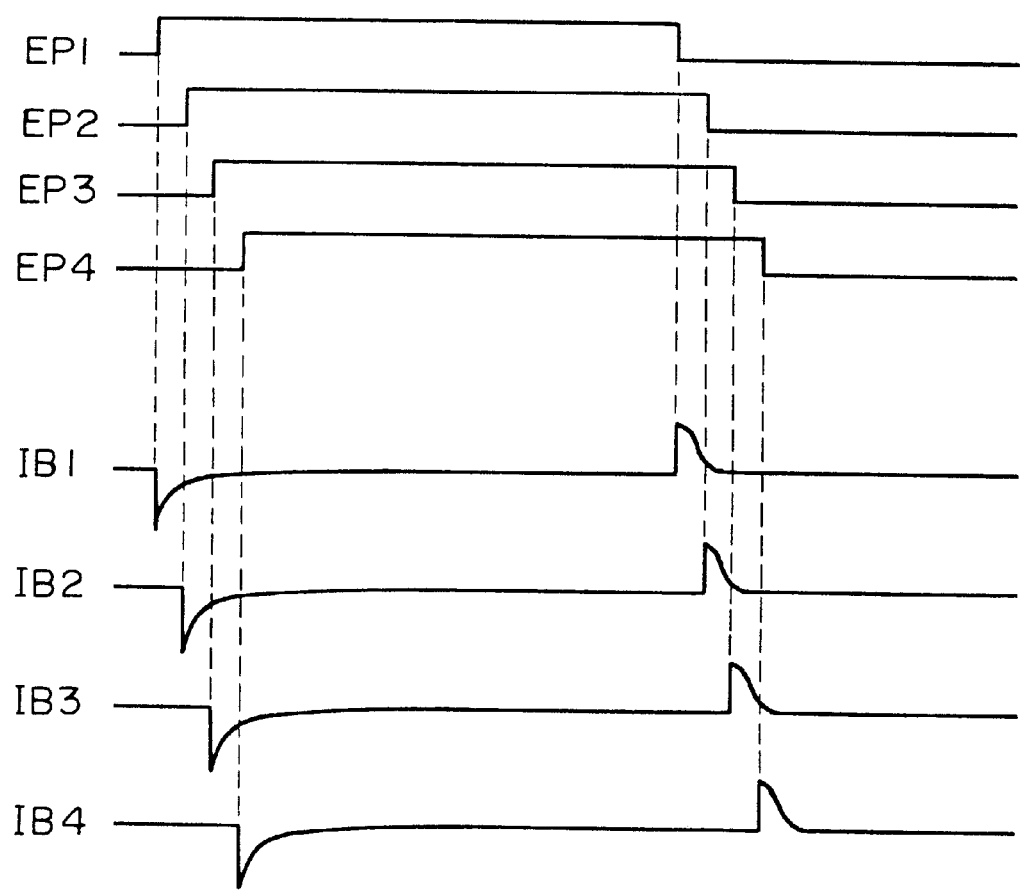

F I G. 26
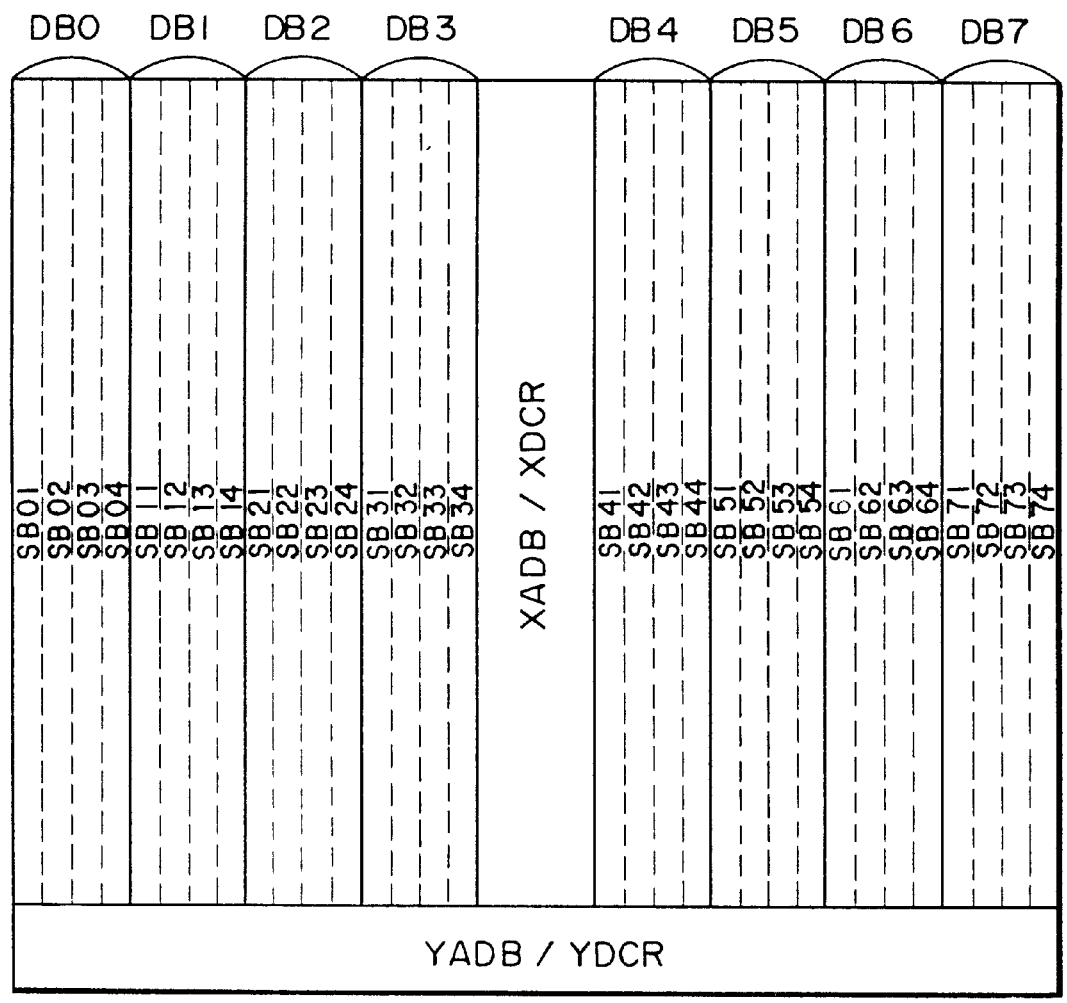

ELECTRICALLY ERASABLE SEMICONDUCTOR NON-VOLATILE MEMORY DEVICE HAVING MEMORY CELL ARRAY DIVIDED INTO MEMORY BLOCKS

This application is a continuation of application Ser. No. 07/942,028, filed Sep. 8, 1992 abandoned; which is a continuation of application Ser. No. 07/568,071, filed Aug. 16, 1990, now abandoned.

BACKGROUND OF THE INVENTION

This invention relates to semiconductor nonvolatile memory devices, and particularly to a semiconductor nonvolatile memory device suitable for use in electrically erasing the contents and rewriting new data.

There are known semiconductor nonvolatile memory devices for storing a program and data such as an erasable and programmable read only memory (hereinafter, abbreviated EPROM) of which the contents, or information can be erased by ultraviolet ray and an electrically erasable and programmable read only memory (hereinafter, abbreviated EEPROM) of which the contents can be electrically erased.

The EPROM has a small memory cell area and thus is suitable for a large capacity, but it needs a package with a window through which an ultraviolet ray is radiated for erasing its contents. Moreover, since data is written in the memory by a programmer, it is required to be removed from the system upon rewriting.

Meanwhile, the EEPROM can be electrically rewritten within the system, but its memory cell area is about 1.5 to 2 times as large as that of the EPROM; therefore, it is not suitable for a large capacity.

Recently, a compromise between both types, which is called a flash EEPROM (a simultaneous electrical erasure EEPROM) has been developed. This flash EEPROM (simultaneous electrical erasure EEPROM) is a nonvolatile semiconductor memory device having the function of electrically erasing data of one chip or a group of memory cells at a time, and of which the size of the memory cell area can be made comparable to that of the EPROM.

FIG. 1 shows the memory cell of the flash EEPROM which was disclosed by Kume in the Proceedings of the IEDM (International Electron Device Meeting), Dec., 6–9, 1987, in an article entitled, "A Flash-Erase EEPROM Cell with an Asymmetric Source and Drain Structure", pp. 560–563. This cell has the stacked gate structure quite similar to that of the normal EPROM.

This memory makes the writing operation by injecting the hot carriers generated in the vicinity of a drain-1 junction into a floating gate 2 as does the EPROM. The threshold voltage as measured from a control gate 4 of the memory cell is increased as a result of performing the writing.

On the other hand, for the erasing operation, the control gate 4 is grounded and a high voltage is applied to a source 3, thereby producing a high electric field between the floating gate 2 and the source 3 so that the electrons accumulated on the floating gate 2 are pulled toward the source 3 through a thin oxide film 5 by the tunneling which occurs. The threshold voltage as measured from the control gate 4 is decreased as a result of performing the erasing.

For the reading operation, to make sure that weak writing is substantially prevented, a low voltage of about 1 V is applied to the drain 1, a voltage of about 5 V is applied to the control gate 4, and the large and small values of the channel current are assigned to logic "1" and logic "0", respectively. In FIG. 1, 6 represents a p-type silicon substrate, 7 and 7' n-type diffusion layers, 8 a low impurity concentration n-type diffusion layer and 9 a p-type diffusion layer.

V. N. Kynett and others have developed a 256 k bit memory using memory cells similar to that shown in FIG. 1. The memory is reported in the IEEE Journal of Solid-State Circuits, vol. 23, No. 5, Oct., 1988, pp. 1157–1162. This memory is capable of performing simultaneous electrical erasure.

FIG. 3 shows a memory cell array which the inventors of the present invention have schemed and considered in an effort to develop a memory cell array capable of information erasure on a memory block-by-memory block basis, by the use of memory cells similar to that shown in FIG. 1. In FIG. 3, the memory cell array is divided into memory blocks B1, B2, . . . , so that information erasure is possible on a memory block-by-memory block basis. Thus, the circuit structure shown in FIG. 3 is not known.

In addition, G. Samachisa and others published a paper directed to a memory cell, formed of a MOSFET, such as, shown in FIG. 2 of the present application, for the simultaneous electrical erasure EEPROM, in the 1987 IEEE International Solid-State Circuit Conference, pp. 76–77.

The operation of this memory cell is substantially the same as that of the memory cell shown in FIG. 1, but is different in that the erasing (in addition to the writing and reading) is also made on the drain side. In accordance with such a memory cell structure, an array of memory cells as shown in FIG. 4 is formed in which the array is divided into memory blocks B11 to B13 respectively associated with data lines D11 to D13. Data lines D11 to D13 are electrically connected to the drains of the corresponding MOSFETS. Therefore, selective erasing can be made for each block at a time, and thus in this point, a memory device having this type of memory cell array is easy to use. In FIG. 4, M21 to M38 represent memory cells, and W11 to W16 word lines.

These memory devices mentioned above, however, do not consider the program disturbance mechanism (or characteristic). The program disturbance characteristic means the change of the threshold value of a MOSFET constituting a memory cell when a high voltage is applied to the gate of the MOSFET, and when no voltage is applied to the drain. The time in which the program disturbance mechanism is occurring in one memory cell (for example, an unselected memory cell during a writing operation) connected to a certain word line is normally the total time in which other memory cells connected to the same word line undergo a writing operation.

For example, in FIGS. 3 and 4, the program disturbance time of the memory M1 (M21) is a sum of the time in which the memory M2 (M22) is written and the time in which the memory M3 (M23) is written.

However, the program disturbance time in which the writing is performed on a memory block-by-memory block basis is different from the above-mentioned disturbance time. If one block B1 (B11) performs no rewriting after writing data once, and if the other blocks B2, B3 (B12, B13) perform a rewriting operation repeatedly, the program disturbance time amounts to the writing time for blocks B2, B3 (B12, B13) multiplied by the number of times that the rewriting is performed.

By the way, G. Verma reported the reliability of the memory cell developed by Mr. Kynett and others, in the 1988 IEEE Reliability Physics Symposium, pp. 158–166. According to this report, after the repetition of rewriting, there occurs a phenomenon in which there is an increase of the adverse effect attributed to the program disturbance characteristic. Thus, this phenomenon of an increase in the adverse effect becomes serious when the program disturbance time is lengthened, as described above.

Also, in the prior art, the circuit arrangement of the memory array within the chip encounters the following problem.

FIG. 5 is a plan view of a geometrical layout of a memory cell array which the inventors of the present invention have schemed with respect to the memory cell structure of FIG. 1 and the circuit structure of FIG. 3. Thus, the layout of FIG. 5 is not known. This plan view is similar to that of the ordinary EPROM. As illustrated, data lines D1 to D4 are made of a metal layer and formed in the longitudinal direction, or in the direction perpendicular to that of word lines W1 to W5, and thus common source lines CS1, CS2 are made of a metal layer and are formed in parallel with the data lines. The common source lines for use in the memory blocks, respectively, originate from a side of the memory array (for example, the upper side in FIG. 5) opposite the side thereof on which a column selection switch MOS FET and a sense amplifier are arranged.

FIG. 6 shows the front face (or main surface) of, for example, a rectangular shaped semiconductor chip depicting the whole circuit arrangement of the memory device. In this figure, the memory array is shown as two separate memory cell arrays, that is, memory cell array M-ARAY 1 for external terminals (or pads) I/O 0 to I/O 3 and memory cell array M-ARAY 2 for external terminals (or pads) I/O 4 to I/O 7. At this time, as in FIG. 5, the word lines are formed in the lateral direction (or horizontal direction in the figure) and the data lines in the longitudinal direction (or vertical direction in the figure). A row address decoder XDCR for selecting and controlling the word lines is disposed in a central plan view area on the front face of the semiconductor chip between the two memory cell arrays M-ARAY 1 and M-ARAY 2, thereby facilitating selection and control of both parts of the memory array at a time. A column address decoder YDCR is formed under the row address decoder XDCR, as shown in FIG. 6, that is in an area on the front face of the semiconductor chip adjacent the central area thereof and near that one of the pair of longer peripheral edges at which the external terminals I/O 0 to I/O 7 are provided. The column selection switch MOS FET and the sense amplifiers YGSNS 1, YGSNS 2 are formed under the memory array parts M-ARAY 1, M-ARAY 2, as shown in FIG. 6, that is, in an area on the front face of the chip adjacent to the corresponding memory cell arrays M-ARAY 1 and M-ARAY 2 and near the same longer peripheral edge of the device as that with respect to the column address decoder YDCR. The erase decoders ECR 1, ECR 2 are formed in areas of the chip adjacent the memory array parts M-ARAY 1, M-ARAY 2, respectively, and near the other one of the pair of longer peripheral edges of the front face of the chip.

Generally, when data of the memory in the system realized on a single substrate is rewritten for each block, the selection of blocks is made by a high-order bit address. For example, for a 1-M bit memory for reading and writing each 8 bits at a time, the address signal is formed of 17 bits of A16 to A0. If the memory array of this memory device is divided into 4 blocks, two bits of A16 and A15 are, preferably, used for selecting a block to be erased.

However, the bonding pads through which signals are supplied are generally arranged as shown in FIG. 6. The flash EEPROM, in general, takes substantially the same arrangement as the EPROM. A 1-M bit flash EEPROM seems to take such an arrangement as illustrated. In FIG. 6, the pads are labeled according to use/function at their positions. The flash EEPROM is different from the 1-M bit EPROM in that it has a terminal $\overline{EE}$. The reason for this arrangement is that the arrangement of input pins of the packaged memory is normally standardized. The circuit arrangement within the chip is limited chiefly by the I/O terminals, or the column selection switch MOSFET and the sense amplifiers YGSNS 1, YGSNS 2 are disposed under the memory array, or near the I/O terminals. The higher-order, or more-significant bit address of A16 and A15 is disposed on the upper side. For minimizing the length of the wiring from each input/output pad to circuits, since the column address decoder YDCR, the column selection switch MOS FET, and sense amplifiers YGSNS 1, YGSNS2 are disposed under the memory array, it is natural that the high-order address of A16 and A15 is used for the row selection address, and that a low-order address is used for the column selection address.

In this case, when the memory blocks are formed along the data lines as shown in FIG. 5, the blocks to be erased are selected by the column address, or the lower-order address. If selection is made differently, that is, using the high-order address, the length of the wiring from the input and output terminals becomes long, and particularly the reading speed is decreased due to the delay in the wiring.

The method of electrically erasing the above flash EEPROM (simultaneous electrical erasure type EEPROM) (electrically erasable and programmable read only memory) is described in the IEEE Journal of Solid State Circuits, vol. 23, No. 5, October, 1988, pp. 1157–1162. When the electrons within the floating gate are pulled toward the source by use of tunneling, the sources of all memory cells are connected together. By a single application of a high voltage to the common source line, it is possible to electrically erase the entire memory array at a time.

Also, it is necessary, upon the start of an erasing operation, to charge the electrostatic capacitance associated with the common source line and, upon ending of an erasing operation, to discharge it.

SUMMARY OF THE INVENTION

In the prior art, no consideration has been given to the program disturbance mechanism, circuit layout, and length of wiring.

Accordingly, it is an object of this invention to provide a semiconductor nonvolatile memory device which is substantially unaffected by the problem of program disturbance and which can easily facilitate electrical erasure for each block at a time.

That is, according to one aspect of this invention, as shown in FIG. 7, the electrically erasable semiconductor nonvolatile memory device is divided into a plurality of memory blocks so that the memory cells connected to one word line belong to one and the same memory block. For an information erasure operation, a high voltage is applied to, for example, the source. In FIG. 7, CS71 to CS73 represent the common source lines for the blocks B71 to B73, respectively, and ERC1 to ERC3 the information erase signal generation circuits for controlling the source line potential for electrical erasing.

According to the above aspect of the invention, the program disturbance time is not dependent on the number of times of rewriting, and is a sum of the time durations in which the other memory cells on the same word line are written in. Moreover, since the row address is used for selecting a memory block, the length of wiring is decreased, and thus the adverse effect on the reading speed can be reduced.

Moreover, in the method of electrically erasing the conventional semiconductor nonvolatile memory device, an undesirable increase of the charge current and discharge current that results upon erasing are not considered, and thus when the erasing is started and stopped, a large charge current and discharge current flow, respectively.

According to another aspect of this invention, in order to reduce the charge current to and discharge current from the memory cell array upon erasing, the memory cell array is divided into two or more memory blocks, and the range of regions, i.e., portion or part, of the memory cell array to be erased, specified from outside of, or within the device, is on a memory block-by-memory block or on a memory sub-block-by-memory sub-block basis, each memory block being divided into memory sub-blocks. And, upon erasing the above range of memory regions, the erasing of memory blocks or memory sub-blocks is performed with a time delay between the memory blocks or memory sub-blocks.

The above-mentioned another aspect of this invention will be mentioned briefly below.

FIG. 12 shows the blocks BL1 to BL16 into which the memory cell array is divided and each of which has a plurality of memory cells each including a field effect transistor element. If blocks BL1 to BL4 or part S of the memory array is a specified range to be erased, the block BL1 is first erased, and a time thereafter the next block BL2 is erased. Also, a time thereafter the block BL3 is erased, and similarly a time thereafter the block BL4 is erased.

Thus, it is possible to reduce the number of the sources, the drains or exclusive gate lines of FET elements to which a high voltage for erasing is applied, the electrostatic capacitance associated therewith and the charging and discharging currents. Also, it can be realized to erase various different combinations of parts of the blocks BL1 to BL16 including simultaneous erasing of all the memory array.

The electrical erasing is performed by applying a high voltage to the sources, drains or exclusive gates of the FET elements of a memory cell group of the blocks, grounding the control gates and pulling the electrons within the floating gates toward the sources, drains or exclusive gates by tunneling.

The application of a high voltage is made by a method using the information erase signal generation circuits ERC1 to ERC4 for applying a high voltage to each of the blocks BL1 to BL4 as shown in FIG. 13, or another method using at least one information erase signal generation circuit ERC for applying a which voltage to a selected one of the blocks BL1 to BL4 as shown in FIG. 14.

The information erase signal generation circuit will be described later.

FIG. 15 is a waveform diagram of voltage waveforms EP1 to EP4 to be applied to the sources, drains or exclusive gates of FET elements, and of current waveforms IB1 to IB4 of charging and discharging currents flowing at this time in the means shown in FIG. 13, and FIG. 16 is similarly a waveform diagram thereof in the means shown in FIG. 14. It is assumed that the electrical erasing is made at the high levels of the voltage waveforms EP1 to EP4 shown in FIGS. 15 and 16. As illustrated, the voltage waveforms EP1 to EP4 are sequentially shifted by a time difference.

According to the above means mentioned with reference to FIGS. 12 to 16, when an entire memory cell array or blocks thereof, corresponding to a part of the semiconductor nonvolatile memory device, are electrically erased, the charging and discharging currents from the memory cell array can be decreased, and the peak erase current can be reduced.

BRIEF DESCRIPTION OF THE DRAWINGS

FIG. 5 is a plan view of a memory cell array shown in FIG. 3.

FIG. 7 is a schematical diagram of a memory cell array according to one embodiment of this invention.

FIGS. 12, 13 and 14 are schematic plan views of memory cell arrays useful for explaining other embodiments of this invention.

FIGS. 15 and 16 are operating-waveform diagrams related to the embodiments of FIGS. 13 and 14, respectively.

FIGS. 20, 22, 24 and 26 are schematic plan views of divided memory arrays in other embodiments of this invention.

DESCRIPTION OF THE PREFERRED EMBODIMENTS

Figure 1:
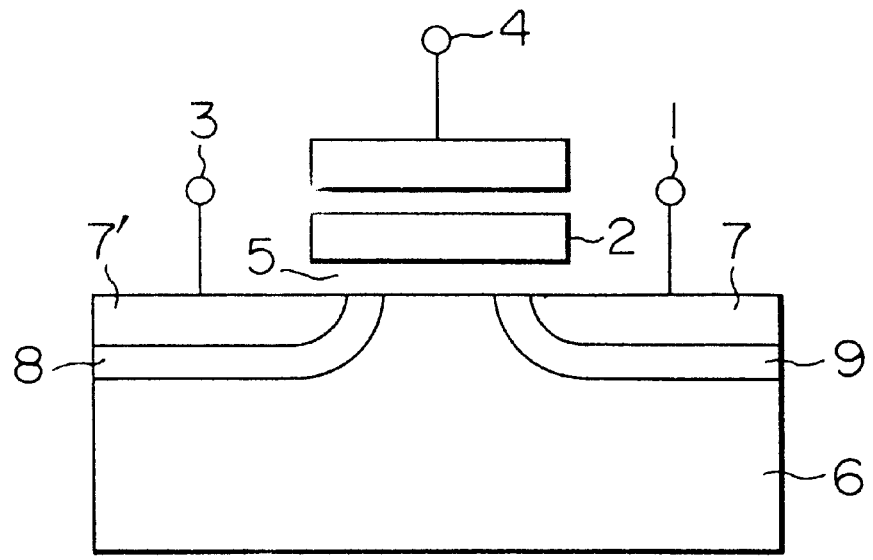
FIGS. 1 to 2 are cross-sectional diagrams of conventional memory cells.
Figure 2:
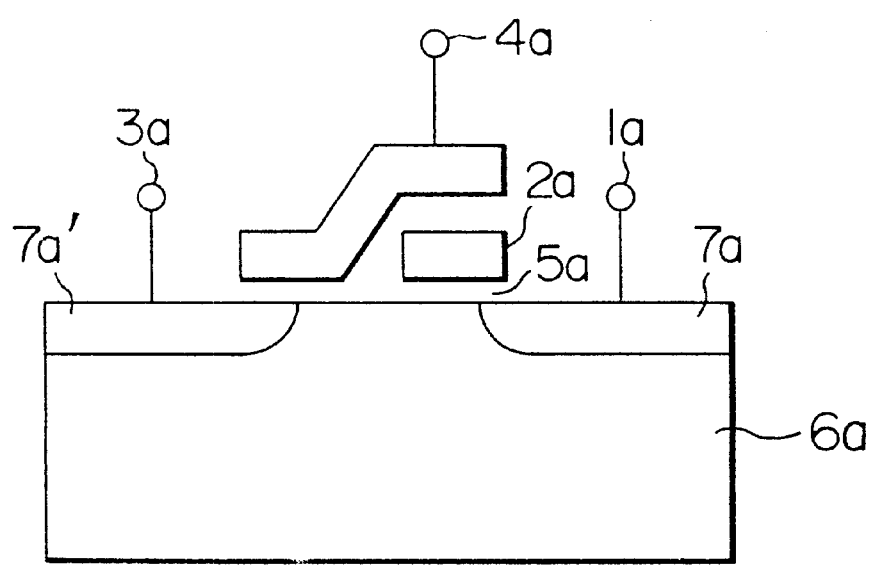

One embodiment of this invention will be described with reference to FIGS. 8 to 11. Here, the memory cell used is as shown in FIG. 2. In other words, writing/reading operation is made on the drain side, and erasing is made on the source side.

The circuit elements shown in these figures are formed in one single-crystalline silicon semiconductor substrate (although not shown herein) or the like by a well-known CMOS (complementary MOS) integrated circuit manufacturing process, though not particularly limited thereto.

The integrated circuit is formed in a singlecrystalline p-type silicon semiconductor substrate, though not particularly limited thereto. The n-channel MOS FET has the source region and drain region thereof formed at a main surface of the semiconductor substrate and the gate electrode thereof, which is made of a polysilicon, is formed through a thin gate insulating film on that part of the main surface of the semiconductor substrate between the source region and the drain region. The p-channel MOS FET is formed in an n-type well region formed at the semiconductor substrate main surface. Thus, the semiconductor substrate constitutes the common substrate to a plurality of n-channel MOS FETs formed on the semiconductor substrate, and is supplied with ground potential used for the circuits. The common substrate gate to the p-channel MOS FETS, or the n-type well region, is supplied with a power supply voltage Vcc. If the integrated circuit formed is a high voltage circuit, it is connected to receive a high voltage Vpp provided from outside the substrate (or chip) or receives an internally generated high voltage or the like. The integrated circuit, alternatively, may be formed on a semiconductor substrate of a single-crystalline n-type silicon. In this case, the n-channel MOS FET is formed in the p-type well region.

Although particularly not limited to the following fact, in the EEPROM of this embodiment, the complementary address signals formed through address buffers XADB, YADB to which X, Y address signals AX, AY are supplied via the external terminals, are supplied to address decoders XDCR, YDCR, respectively. Also, although particularly not limited to the following fact, the address buffers XADB, YADB are enabled by an internal chip selection signal ce, and receive the address signals AX, AY from the external terminals to produce the complementary address signals formed of an in-phase address signal and opposite-phase address signal relative to those address signals.

The row address decoder XDCR is enabled by an address decoder enable signal DE to produce a selection signal for the word line W of the memory array M-ARAY according to the complementary address signals from the address buffer XADB. The column address decoder YDCR is enabled by the address decoder enable signal DE to produce a selection signal for data lines D71 to D73 of the memory array M-ARAY according to the complementary address signals from the address buffer YADB.

The memory array M-ARAY is represented by two memory blocks each of which has a plurality of nonvolatile memory cells arranged in rows and columns. These memory blocks B71 and B72 are formed of memory elements (nonvolatile memory cells) M71 to M76 and M77 to M82, word lines W71–W72 and W73–W74 and data lines D71 to D73.

The gates of FET elements of memory cells arranged on each row in the memory block are connected to the corresponding word lines, and the drains of FET elements arranged on each column are connected to the corresponding data lines. The sources of the FET elements in each memory block are coupled to a respective one of the common source lines CS71, CS72. In this embodiment, there are provided information erase signal generators EC1 and EC2 for the common source lines CS71 and CS72, in which n-channel MOS FETs Q10, Q20 are used to controllably apply in response to the output signals from the information erase signal generators, in a writing/reading operation, a ground potential to the common source lines CS71, CS72, and in which p-channel MOS FETs Q17, Q20 are used for controllably applying the high voltage Vpp to the common source lines CS71, CS72 for effecting erasing. The MOS FETs Q17, Q10 and MOS FETs Q19, Q20 constitute a CMOS circuit. The sources of the FET elements of memory cells on one or more rows of a corresponding memory block are connected to one common source line.

Although particularly not limited to the following fact, a total of 8 or 16 memory arrays each of which is mentioned above are provided for writing/reading for each 8 bits or 16 bits at a time. Here, an 8-bit arrangement is used, and one memory array thereof is typically shown.

For writing and reading, for example, each 8 bits at a time, 8 memory arrays one of which is shown are necessary. In this case, the memory cells of which the gates are connected to one word line belong to the same memory block.

The data lines D71 to D73, constituting the one memory array M-ARAY, are connected through column selection MOS FET switches Q7 to Q9, which receive the selection signal formed by the address decoder YDCR, to the common data line CD. The common data line CD is connected to receive write data from the output terminal of the writing data input buffer DIB, which receives the write signal supplied via the external terminal I/O, through a MOS FET Q18 which is ON in a writing operation. In the other memory arrays of the multi-bit arrangement, similar column selection MOS FET switches are provided, and the selection signal is produced from the corresponding address decoder.

The common data line CD provided, associated with the memory array M-ARAY, is also coupled through the switch MOS FET Q16 to the sense amplifier. For convenience of explanation, the circuit formed of MOS FETS Q11 to Q15 and Q22 to Q25 is called the sense amplifier.

Figure 8:
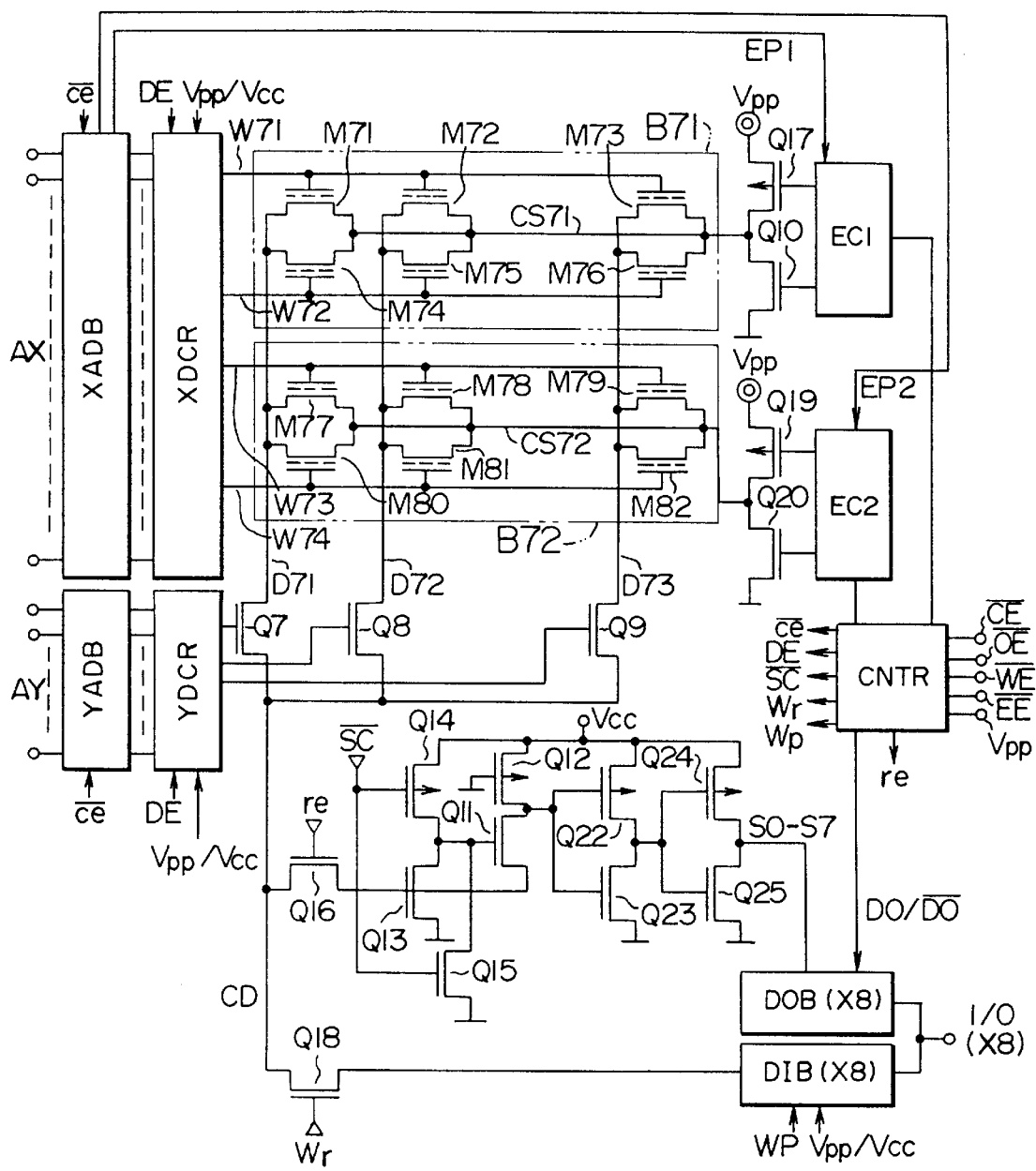
FIG. 8 is a circuit diagram of another embodiment of a semiconductor memory device of this invention.

In other words, in FIG. 8, the common data line CD exemplarily shown is connected to the source of an n-channel MOS FET Q11 through the MOS FET Q16 of which the source is connected to the MOS FET Q11 and which is turned ON by the read control signal re generated by the circuit CNTR. The drain of the n-channel MOS FET Q11 is connected to the power supply voltage terminal Vcc through a p-channel load MOS FET Q12 of which the gate is supplied with ground potential for circuits. The load MOS FET Q12 operates to supply a precharge current for reading to the common data line CD.

In order to increase the sensitivity of the MOS FET Q11, keep the data line CD substantially at a constant voltage and prevent weak writing during reading, the potential of the common data line CD is supplied through the switch MOS FET Q16 to the gate of an n-channel drive MOS FET Q13 which is the input side of an inverting amplifying circuit formed of the n-channel load MOS FET Q13 and a p-channel load MOS FET Q14. The output voltage from the inverting amplifying circuit is supplied to the gate of the MOS FET Q11. Moreover, to prevent useless current consumption during the nonoperation period of the sense amplifier, an n-channel MOS FET Q15 is provided between the gate of the MOS FET Q11 and the circuit ground potential point. The gates of the MOS FET Q15 and the P-channel MOS FET Q14 are supplied with a timing signal sc for operation of the sense amplifier.

The timing control circuit CNTR, though particularly not limited to the following, is constituted by CMOS logic circuits, and is responsive to the chip enable signal, output enable signal, write enable signal, erase enable signal and write/erase high voltage supplied through the external terminals $\overline{CE}$, $\overline{OE}$, $\overline{WE}$, $\overline{EE}$ and Vpp, respectively, to produce the timing signals such as internal control signals ce, sc, a read low voltage Vcc/write high voltage Vpp, and so on.

In the read mode of EEPROM device, the internal signal $\overline{ce}$ is low, and the DE, sc and re are high. The address decoder circuits XDCR, YDCR are enabled, and one word line and one data line are selected. The address decoder circuits XDCR, YDCR and data buffer input circuit DIB are supplied with a low voltage Vcc as the operating voltage. The MOS FET Q14 within the sense amplifier is turned ON, and the MOS FET Q15 is turned OFF.

The memory cell (FET element) has a high or low threshold value relative to the selection level of the word line, in accordance with the written data. When the memory cell is switched OFF since the threshold value thereof is selected to be high in response to the address decoders XDCR, YDCR even under the condition that the corresponding word line is at the selection level, the common data line CD is made to be at a relatively high level by the current supplied via MOS FETs Q12, Q11 within the sense amplifier. On the other hand, when the selected memory cell is switched ON by the word line selection level, the common data line CD becomes a relatively low level.

In this case, the high level of the common data line CD is limited to a relatively low potential by the application of the output voltage of a relatively low level, generated by the inverting amplifying circuit Q14, Q13 in response to the high level voltage on the line CD, to the gate of the MOS FET Q11. The low level of the common data line CD is limited to a relatively high potential by the application of the output voltage of a relatively high level, generated by the inverting amplifying circuit Q14, Q13 in response to the low level voltage on the line CD, to the gate of the MOS FET Q11.

The amplifying MOS FET Q11 operates to amplify the input from the gate grounded source and supply its output signal to a CMOS inverter circuit formed of MOS FETs Q22, Q23. This output signal is waveform-shaped by an inverter formed of MOS FETs Q24, Q25. The output signals SO to S7 from the sense amplifier become high when the threshold value is high, whereas they become low when it is low. These signals are amplified by the corresponding data output buffer circuit DOB, and transmitted through the external output terminal I/O. This data output buffer circuit DOB is controlled by data output buffer control signals DO, $\overline{DO}$ from the timing control circuit CNTR. The control signal DO is high in the read mode and verify mode after writing, and enables the data output buffer circuit DOB to supply data to the I/O terminal. Between the common data line CD corresponding to other memory block and the external terminals are provided the sense amplifier and read circuit including data output buffer DOB same as mentioned above.

In the write mode of EEPROM device, the internal signal $\overline{ce}$ is low, DE, $W_p$ (write control signal) and wr (write data-control signal) are high, and $\underline{sc}$, $\underline{re}$ and DO are low. The address decoder circuits XDCR, YDCR are enabled to select one word line and one data line. The address decoder circuits XDCR, YDCR and data input circuit DIB are respectively supplied with a high voltage Vpp as the operating voltage. The MOS FET Q16 is switched OFF, and the data output buffer circuit DOB and sense amplifier are disabled. The word line on which writing is made is supplied with the high voltage Vpp. The data line connected to the memory cell in which its floating gate is to be injected with electrons is connected through the MOS FET Q18 to the DIB to receive the high voltage Vpp. Thus, the memory cell is written in. The written memory cell has a high threshold voltage as a result of accumulating electrons in the floating gate, so that even if the word line is selected, the drain current does not flow. When no electrons are injected, the threshold voltage is low, and when the word line is selected, a current flows.

Between the common data line CD associated with other memory block and the external terminals are also provided the same write circuit including an input stage circuit and data input buffer circuit DIB as described above.

In the erase mode of the EEPROM device, the control signals DE, wr, re, DO, sc and $W_p$ are low. All or part of the X address signal AX supplied via the external terminals is used to select blocks to be erased, and the word lines of the blocks are all at the ground potential. At this time, the word lines of the other blocks may be at any potential. The erase pulse EP1 and/or EP2 associated with the selected blocks is made low, and a high voltage is supplied through an information erase signal generator EC1 or EC2 to the source of the memory cell.

Figure 9:
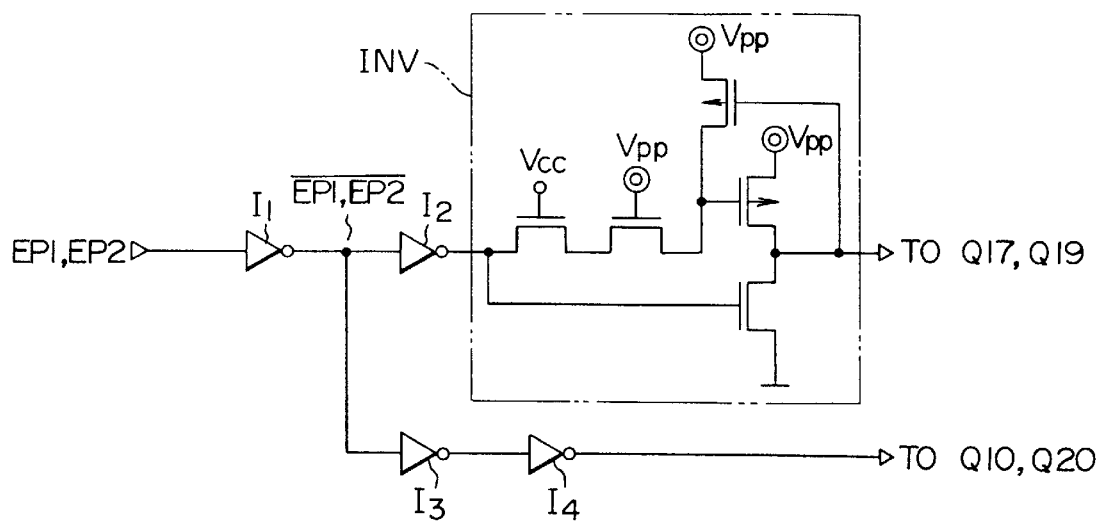
FIG. 9 is a circuit diagram of the information erasure signal generation circuit used in the embodiment of this invention.

Although particularly not limited to the following, the information erase signal generator EC1, EC2 is constructed as shown in FIG. 9. The erase pulse EP1, Ep2 is supplied through inverters $I_1$ and $I_2$ and a high voltage inverter INV which are fundamentally powered by the Vcc, to the gates of the PMOS FET Q17, Q19, and through inverters $I_1$, $I_3$, $I_4$ which are powered by the Vcc, to the gates of NMOS FET Q10, Q20. If, for example, block B71 is selected, the word lines W71, W72 are grounded, and a high voltage is applied to a common source line CS71. Thus, the memory cells M71 to M76 are electrically erased. In this case, the other blocks are not erased since a high voltage is not applied thereto.

The memory blocks, divided as shown in FIGS. 7 and 8, cannot be made in the manufacturing method described in the well known example. This is because the well known example has the same plan structure as in the normal EPROM shown in FIG. 5. Since as shown in FIG. 5, the data lines are made of a metal layer and formed to extend in the vertical direction, or in the direction perpendicular to the direction of the word lines, the common source lines CS1, CS2 are formed of a metal layer in parallel with the data lines, and these common source lines are formed common to each block on the opposite side (on the upper side in the drawing) to the side on which the column selection switch MOS FET and the sense amplifier are disposed relative to the memory array.

Figure 10:
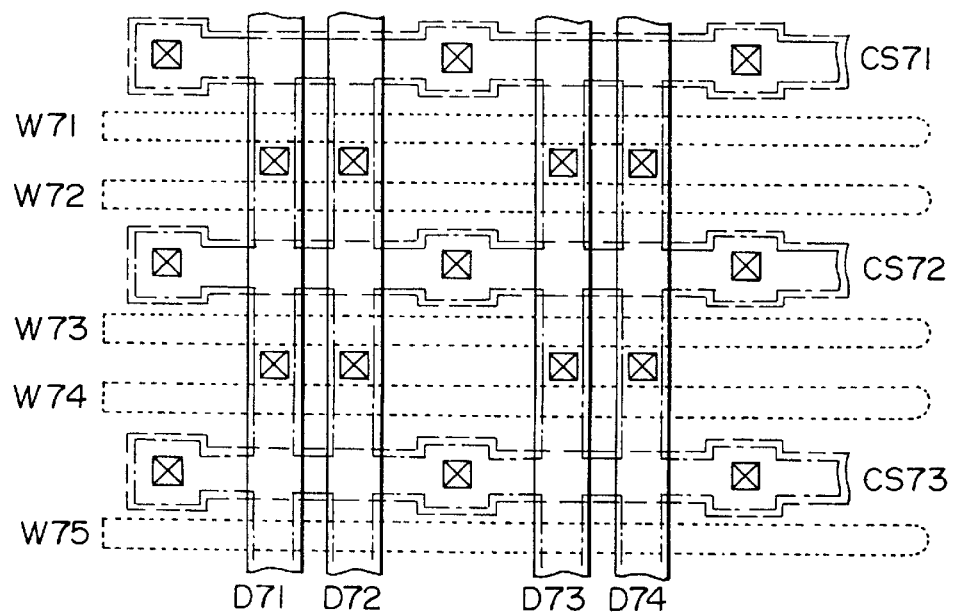
FIG. 10 is a plan view of the memory cell array in this embodiment of this invention.

In other words, in order to realize the block division shown in FIGS. 7 and 8, the plan structure shown in FIG. 10 must be effected. Here, the common source lines CS71 to CS73 are made of a layer different from that of the data lines D71 to D74 to extend laterally, or in parallel with the word lines W71 to W75. The common source lines desirably have a low resistance because they are used to maintain the sources of the memory cells at ground potential upon reading or writing, and to this end the common source lines are made of a metal layer different from that of the data lines.

Figure 6:
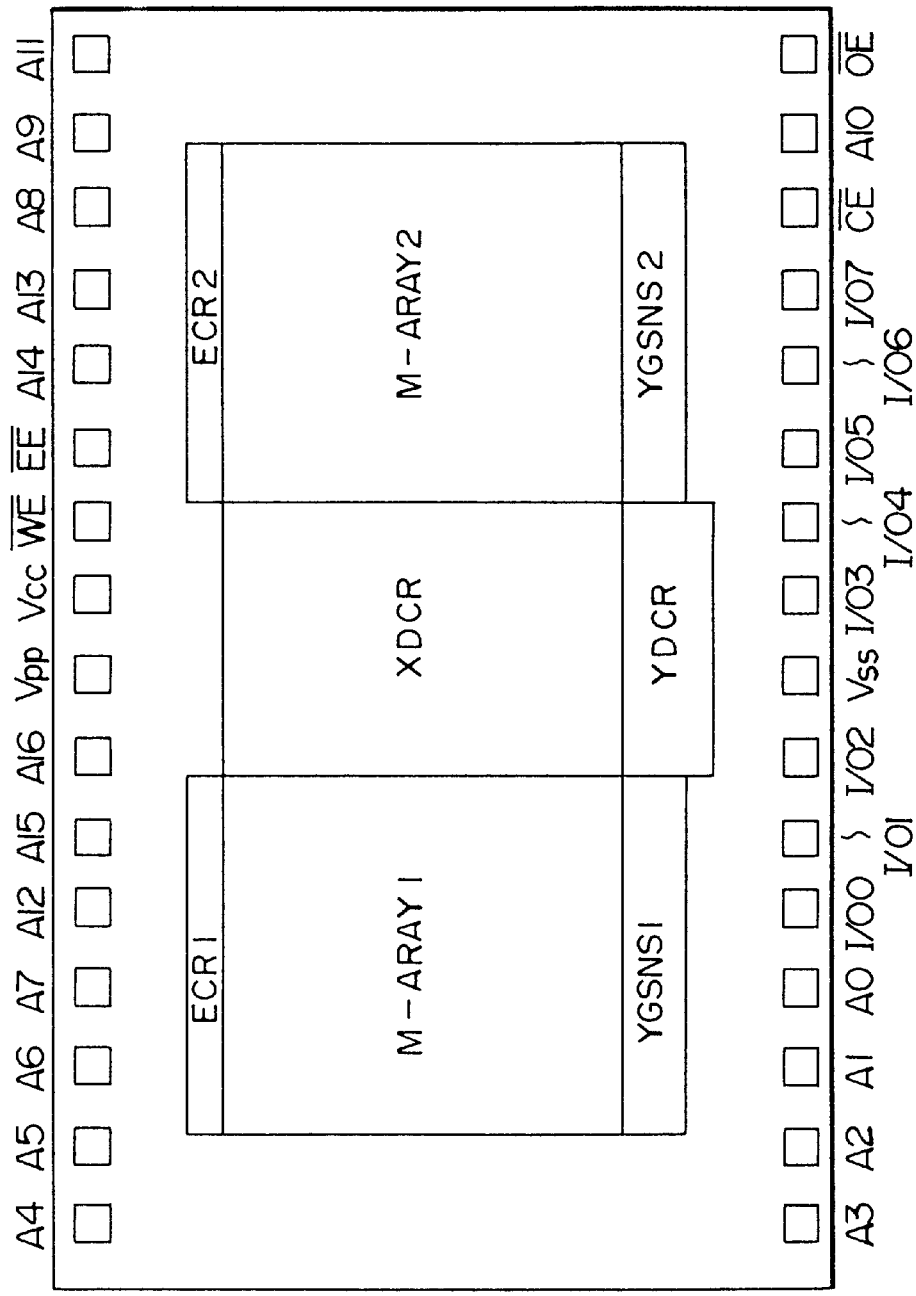
FIG. 6 is a schematic plan view of a conventional semiconductor memory device.
Figure 11:
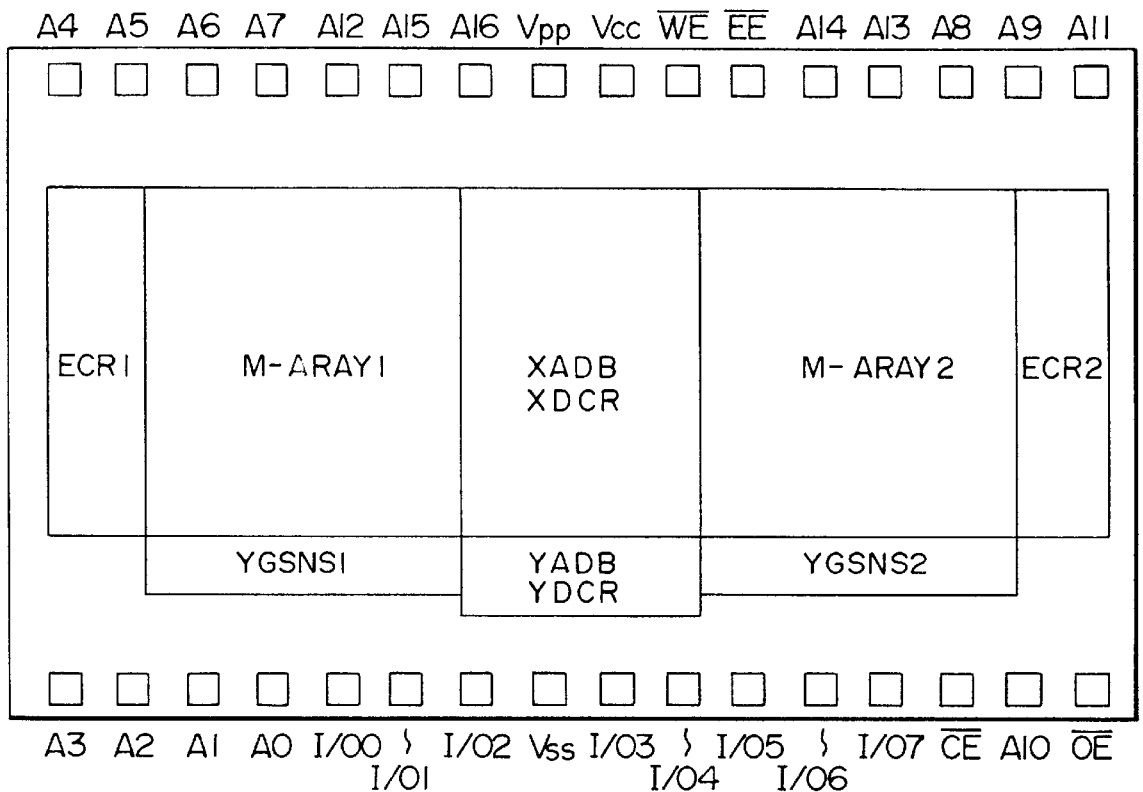
FIG. 11 is a plan view of still another embodiment of a semiconductor memory device of this invention.

FIG. 11 is a circuit arrangement of the semiconductor chip having above structure and similar to that shown in FIG. 6.

The semiconductor chip is substantially rectangular, and has an electrically erasable semiconductor nonvolatile memory device and a plurality of connection pads including address signal pads A0–A16 and I/O pads I/00–I/07 in a peripheral portion of the chip. The semiconductor memory device may include, as shown in FIGS. 7 and 8, for example, semiconductor memory cell arrays M-ARAY1 and M-ARAY2, respectively, each having a plurality of nonvolatile memory cells arranged in rows and columns and a plurality of word line conductors and a plurality of data line conductors, a row address decoder XDCR and a row address buffer circuit XADB, a column address decoder YDCR and a column address buffer circuit YADB, information erasure signal generating circuits ERC1 and ERC2, and sense amplifiers YGSNS1 and YGSNS2.

The row address decoder XDCR, provided for electrical connection with the address signal pads A4–A16, that is, for relatively higher order digits, is disposed in an area, covering a central plan view portion on the front face of the semiconductor chip which is between near end sides of the semiconductor memory cell arrays M-ARAY1 and M-ARAY2, as viewed in a direction substantially parallel with the word line conductors. Meanwhile, the column address decoder YDCR is provided in an area, covering a different plan view portion on the front face of the semiconductor chip, in the vicinity of the semiconductor memory cell arrays and near that one of the pair of longer peripheral edges at which the external terminals (pads) I/O 0–I/O 7 and address external terminals (pads) for relatively lower order digits (e.g., A0–A3) are disposed (for example, at the lower portion of the row address decoder XDCR as viewed on the drawing) so that electrical connection with the address signal pads A0–A3 for relatively lower order digits can be easily facilitated. The information erasure signal generating circuits ERC1 and ERC2, provided for effecting electrical connection with at least a portion of the address signal pads A4–A16 for relatively higher order digits and selectively applying an information erasure signal to the semiconductor memory cell arrays, are respectively formed to cover other plan view areas on the front face of the semiconductor chip and which are disposed adjacent end sides of the corresponding areas of the semiconductor memory cell arrays, opposite end sides thereof adjacent the area for the row address decoder XDCR, as viewed in a direction substantially parallel with the word line conductors. The sense amplifiers YGSNS1 and YGSNS2 are formed to cover plan view areas on the front face of the semiconductor chip adjacent one of two opposite end sides of the semiconductor memory cell arrays M-ARAY1 and M-ARAY2, respectively, as viewed in a direction substantially parallel with the data line conductors, near that one of the pair of longer peripheral edges of the semiconductor chip at which external terminals I/O 0–I/O 7 are provided and for effecting electrical connection therewith.

According to this embodiment, since the common source lines are formed to extend in a direction substantially parallel with the word lines, and the memory is divided into blocks along the word lines, the information erase signal generating circuits ECR1, ECR2 (for controlling erasure of a memory block to be selected through the common source line in an erasing mode) can be positioned, with respect to a plan view area, on the front face of the semiconductor chip adjacent an end side of the memory array opposite the end side thereof at which the row address decoder XDCR of the memory array is disposed adjacent thereto. Thus, as in the prior art, if the higher-order address such as A16 and A15 is used for the selection of the row address, and the low-order address for the selection of the column address, the block to be erased is selected by the row address, or the higher-order address. Therefore, the length of the wiring from the input and output terminals is decreased as compared with the previous example, so that the adverse effect on the read speed is reduced.

In that case, each exclusive-use gate line or several exclusive-gates lines are treated as one block.

While in this embodiment an external high voltage Vpp is applied for writing/erasing, this invention is not limited thereto. If a small current flows upon writing/erasing, a necessary high voltage may be generated from the Vcc within the device, and used for writing/erasing. Moreover, this internally boosting voltage source may be used together with the external high voltage Vpp.

This invention is, of course, not limited to the above embodiment. The arrangement of the circuits for controlling the normal writing/reading and so on and the arrangement of the circuits for controlling the erasing operation may be arbitrary if the above action can be realized.

According to this embodiment, as described above, the electrically erasable semiconductor nonvolatile memory device with memory cells as small as EPROM can be partially erased.

Figure 17:
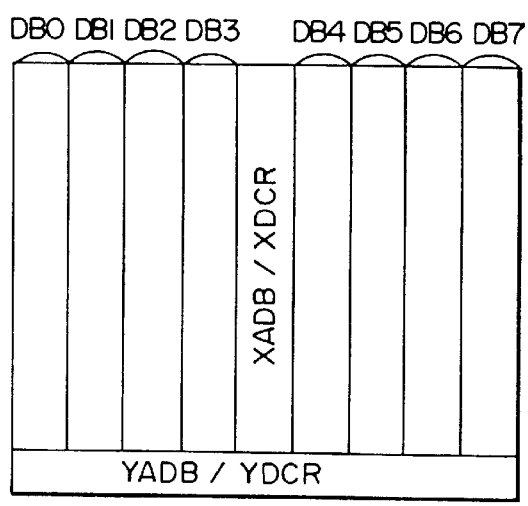
FIG. 17 is a schematical plan view of a divided memory cell array in a further embodiment of this invention.
Figure 18:
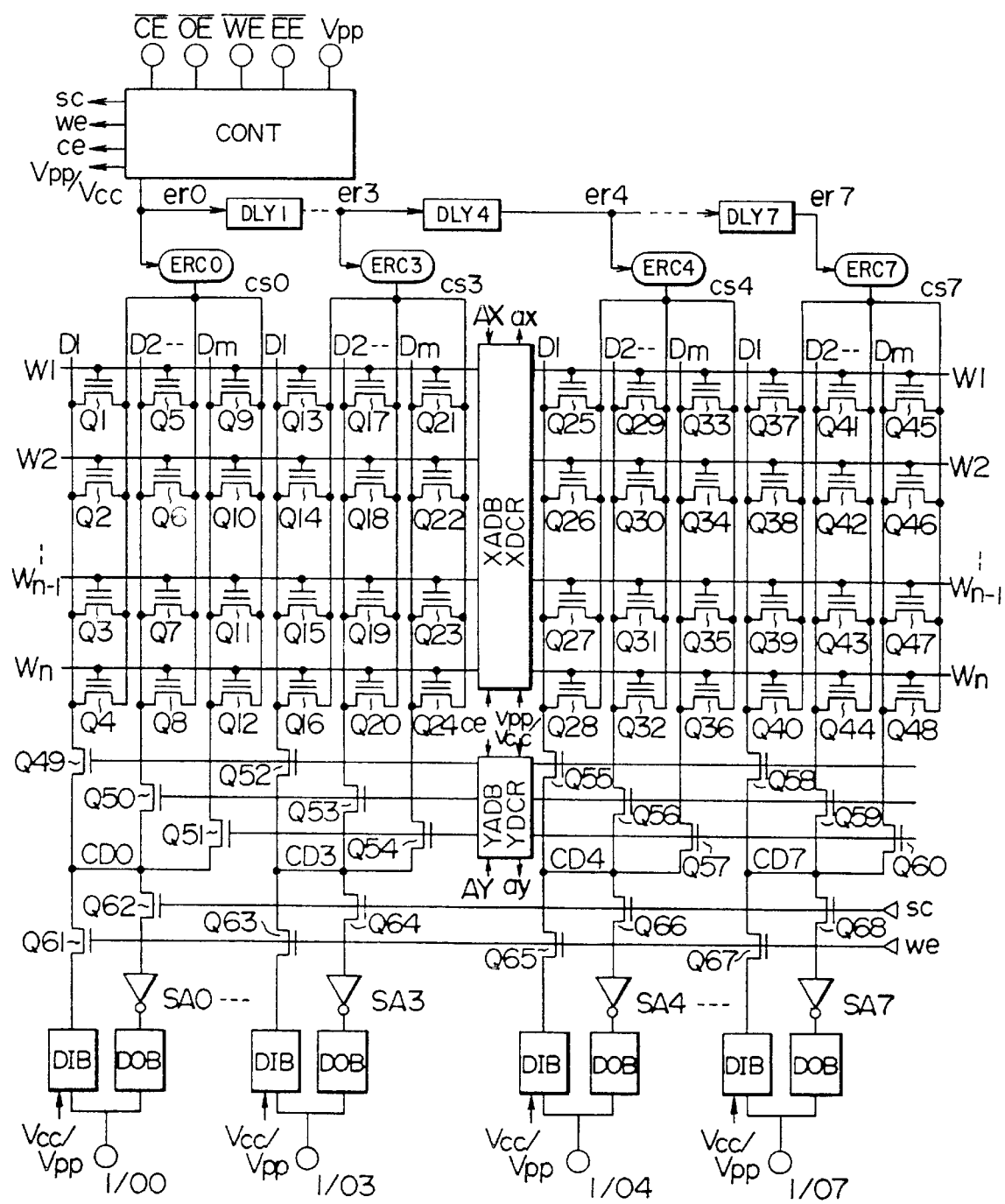
FIG. 18 is a circuit diagram of still another embodiment of a semiconductor memory device of this invention.

Another embodiment of this invention will be described with reference to FIG. 17. In this embodiment, all the memory is erased. The memory array, as shown in FIG. 17, has a plurality of memory blocks arranged in columns. In FIG. 17, XADB/XDCR and YADB/YDCR represent the row address decoder/row address buffer circuit and column address decoder/column address buffer circuit, respectively. This arrangement may be changed. The memory blocks coincide with unit blocks DBO to DB7 for writing/reading which will be described later. FIG. 18 is a circuit diagram of the memory array of the corresponding semiconductor nonvolatile memory.

The circuit elements, though particularly not limited to the following, are formed on a semiconductor substrate such as a single crystalline silicon substrate by a well-known CMOS (complementary MOS) integrated circuit manufacturing process.

The integrated circuit is formed on a semiconductor substrate of single crystalline p-type silicon, though particularly not limited thereto. The n-channel MOSFET being formed has a source region, a drain region and a gate electrode, made of poly silicon, which is formed, through a thin gate insulating film, on a part of a main surface of the semiconductor substrate between the drain and source regions. The p-channel MOSFET, on the other hand, is formed in an n-type well region formed on the main surface of the semiconductor substrate. Thus, the semiconductor substrate serves as the substrate gate common to a plurality of n-channel MOSFETs formed thereon, and is supplied with ground potential for the circuits being formed. The substrate gate common to the p-channel MOSFETS, or the n-type well region is connected to the power supply voltage Vcc or to the high voltage Vpp externally applied or the internally generated high voltage. The integrated circuit may be formed on a single crystalline n-channel silicon semiconductor substrate. In this case, the n-channel MOSFETs are formed in the p-type well region.

Particularly though not limited to the following, in the semiconductor nonvolatile memory device of this embodiment the complementary address signals formed through the address buffers XADB, YADB which receive the row (X), column (Y) address signals AX, AY from the external terminals are supplied to the row, column address decoders XDCR, YDCR, respectively. Particularly though not limited to the following, the row, column address buffers XADB, YADB are enabled by the selection signal $\overline{ce}$ from within the device to receive the address signals AX, AY from the external terminals and to form the complementary address signals including an internal address signal which is in phase with the address signal fed from the external terminal and an address signal of opposite phase therefrom.

The row (X) address decoder XDCR generates the selection signal for word line W of the memory cell array according to the complementary address signal from the address buffer XADB. The column (Y) address decoder YDCR generates the selection signal for data line D of the memory array according to the complementary address signal from the address buffer YADB.

Figure 12:
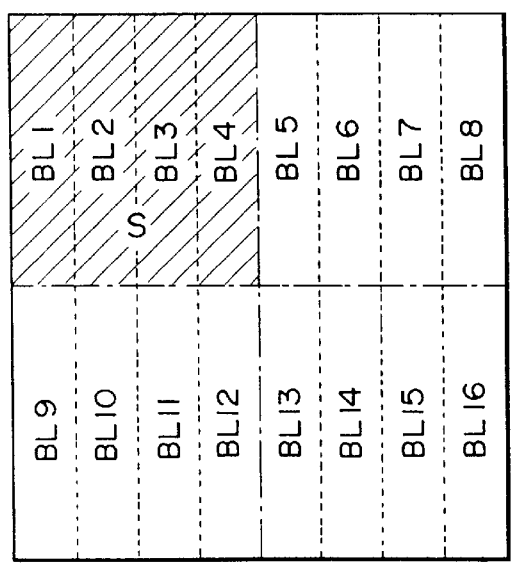

Particularly though not limited to the following, the memory cell selection is made for 8 or 16 memory cells by the row address decoder XDCR and column address decoder YDCR because writing/reading is performed for each 8 bits or 16 bits. Hereinafter, a group of memory cells each corresponding to one bit is represented by the data block DB, and in this embodiment the data block DB is formed of 8 bits. The memory cells of one data block DB is formed of n cells in the word line direction (row direction) and m cells in the data line direction (column direction). In other words, the memory array includes 8 data blocks DB of n×m memory cells each. In this embodiment, the data block DB coincides with the memory block BL (FIG. 12) which is erased at a time.

The memory cell array has a plurality of row and column memory cells (for example, semiconductor nonvolatile memory cells/MOSFETs Q1 to Q48 in FIG. 18) including FET elements of the stacked structure having the source region and the drain region formed in the substrate and the control gate and the floating gate arranged in row and column directions, word lines (word line conductors) W, data lines (data line conductors) D, and common source lines (common source line conductors) CS. The common source lines substantially extend in the column direction on the substrate, a predetermined number of common source lines being electrically interconnected and connected to an information erase signal generation circuit shown in FIG. 19 as will be described later. The source lines CS0, CS1, . . . of each data block are, upon erasing, supplied with the high voltage Vpp and, upon writing/reading other than erasing, supplied with ground potential for the circuits. In the memory cell array shown in FIG. 18, the control gates of the memory cells arranged in the same row, for example, Q1, Q5, Q9, Q13, Q17, Q21, Q25, Q29, Q33, Q37, Q41 and Q45 are connected to the corresponding word lines W1. The drains (regions) of the memory cells in the same column, for example, Q1 to Q4, Q13 to Q16, Q25 to Q28, Q37 to Q40 are connected to the corresponding data lines D1.

The data lines D1 to Dm of each data block DB (DB0, DB1, . . . ) are connected through the column selection switch MOSFETs Q49 to Q60, which receive the selection signal formed by the column address decoder YDCR, to the common data lines CD. The common data lines CD (CD1, CD2, . . . ) are connected to the output terminals of the write data input buffer DIB which receive the write signals from the external terminals I/O, through the MOSFETs Q61, Q63, Q65, Q67 which receive the write control signal we that is at an ON level upon writing. The common data lines CD are connected to the sense amplifier SA through the switch MOSFETs Q62, Q64, Q66, Q68 which receive the read control signal sc which is at an ON level upon reading, and also to the external terminals I/O through the read data output buffer DOB.

The sources of a memory cell group of a predetermined number of columns, or m columns of each data block are connected to the common source lines CS0 to CS7, and to the erase control circuits ERC0 to ERC7.

Figure 19:
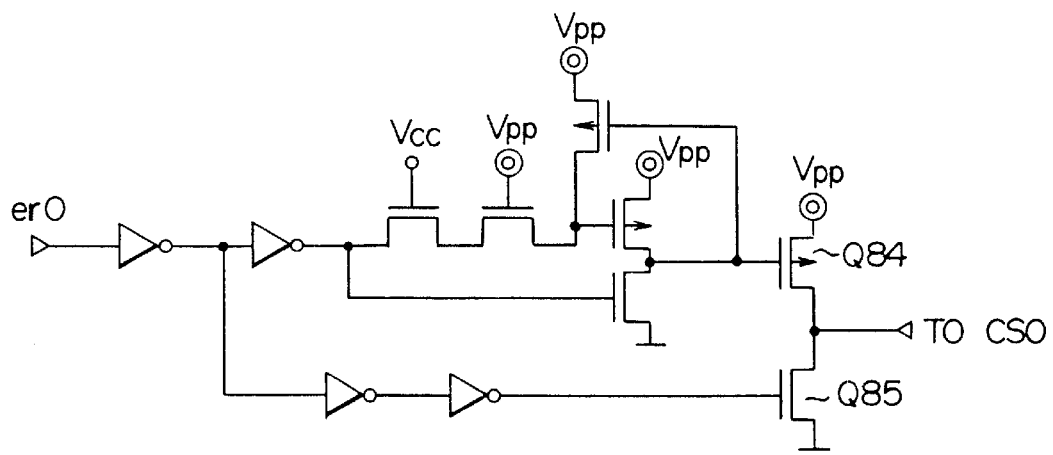
FIG. 19 is a circuit diagram of the information erase signal generation circuit used in the embodiments of this invention.

FIG. 19 is a circuit diagram of the information erase signal generation circuit ERC. In FIG. 19, the erase control circuit ERC has n-channel MOSFETs Q85 which are switched ON during the writing or reading operation to supply ground potential for circuits to the source lines CS, and p-channel MOSFETs Q84 which are switched ON to supply the high voltage Vpp for erasing.

In FIG. 18, the erase signal er0 generated from the timing control circuit CONT is supplied to the erase control circuit ERC0 which is connected to the common source lines CS0 of the data block DB0 and to the delay circuit DLY1, and the output signal er1 from the delay circuit DLY1 is supplied to the erase control circuit ERC1 and delay circuit DLY2 of the following data block. Thus, the erase signal er for the previous block is supplied through the delay circuit DLY to the erase control circuit ERC of the next block.

The timing control circuit CONT, particularly though not limited to the following, is constituted by CMOS logic circuits and is responsive to the chip enable signal, output enable signal, write enable signal, erase enable signal and write, erase high voltage fed to the external terminals $\overline{CE}$, $\overline{OE}$, $\overline{WE}$, $\overline{EE}$ and Vpp, respectively, to generate timing signals such as the internal control signals ce, sc, we, and erase signal ero, and the read power supply voltage Vcc, write high voltage Vpp and so on which are selectively supplied to the address decoder and so on.

The above memory cell, particularly though not limited to the following, is similar in its construction to that of the EPROM (erasable programmable read only memory). However, it is different from the conventional method of erasing the EPROM by use of ultraviolet ray in that the erase operation is electrically made by the tunneling between the sources, which are connected to the source line, and the corresponding floating gates.

Upon writing, the above internal signals ce and we are made a high level, respectively. The row, column address decoder circuits XDCR, YDCR and the data input buffer circuit DIB are supplied with the high voltage Vpp for the operating voltage. The word lines W (W1, W2, . . . ) through which writing is made are supplied with the high voltage Vpp. The data lines D (D1, D2, . . . ) connected with the memory cells of which the floating gates are to be injected with electrons are connected to the same high voltage Vpp as above. Thus, the memory cells are written in. The written memory cells have electrons accumulated on the floating gates.

Upon reading, the internal signals sc and ce are at a high level, respectively. The row, column address decoder circuits XDCR, YDCR and the data input buffer circuit DIB are supplied with the power supply voltage Vcc for the operating voltage. The word lines W connected to the memory cells to be read are supplied with the power supply voltage Vcc, and the data lines D are supplied with a low voltage of about 1 V for suppressing the weak writing from the sense amplifier SA. By this operation, the memory cells are read from. Since the written memory cells have electrons accumulated on the floating gates, and a high threshold voltage, drain current does not flow even if the word lines W are selected upon reading. The memory cells in which electrons are not injected have a low threshold voltage, and the current flows when the word lines W are selected. This current is received by the sense amplifier SA and supplied through the data output circuit DOB to the external terminal I/O. Thus, the memory cells are read from.

Upon erasing, the above internal signal ce and the erase signal er0 are high level and the internal signals sc and we are made low level. The erasing can be started by supplying the control signal indicating the erase operation from the external terminal. At this time, all the word lines W are at nonselection level such as ground potential. When the erase signal er0 generated from the timing control circuit CONT is at a high level, the p-channel MOSFET Q84 within the information erase signal generation circuit ERC0 shown in FIG. 19 is ON, and the n-channel MOSFET Q85 is OFF, thus the high voltage for erasing being supplied to the common source line CS0 shown in FIG. 18. Therefore, the memory cell group Q1 to Q12 of the data block DB0 as one of the blocks of the memory array is erased. At this time, a high electric field is established from the control gate to the source so that the electrons accumulated on the floating gate of the memory cell are pulled toward the source lines by the tunneling, thus resulting in an erase operation.

The memory cell group of the next data block DB1 starts erasing when the charging current is sufficiently reduced after the start of the operation of the data block DB0, in accordance with the relation between the high voltage application waveform EP (EP1, EP2, . . . ) and the charging current waveform IB (IB1, IB2, . . . ). This time delay is made by the delay circuit DLY1. Similarly, the memory group of the data block DB7 connected to the information erase signal generation circuit ERC7 starts erasing when the charging current to the data block DB6 is sufficiently reduced. When the control signal er0 from the control circuit CONT is low level at which the erasing operation is stopped, the p-channel MOSFET Q84 within the information erase signal generation circuit ERC0 shown in FIG. 19 is turned OFF, and the n-channel MOSFET Q85 is turned ON. Ground potential for circuits is supplied to the common source line CS0 shown in FIG. 18, stopping the tunneling, thereby ending the erase operation of the memory cell group of the data block DB0. At this time, since charging current flows from the data block DB0, the memory cell group of each data block DB stops erasing after a delay time just as upon starting to erase, in accordance with the relation between the high voltage application waveform EP and the charge, discharge current waveform IB shown in FIG. 15.

Thus, the whole memory array can be electrically erased with the charging and discharging currents from the memory array being reduced upon erasing.

While in this embodiment the erasing is made by applying a high voltage Vpp from the external, this invention is not limited thereto. If the current flowing upon writing or erasing is small, the desired high voltage Vpp may be produced from the power supply voltage Vcc within the device and used for writing or erasing. The internal voltage boosting power supply may be used together with the external high voltage Vpp.

Figure 20:
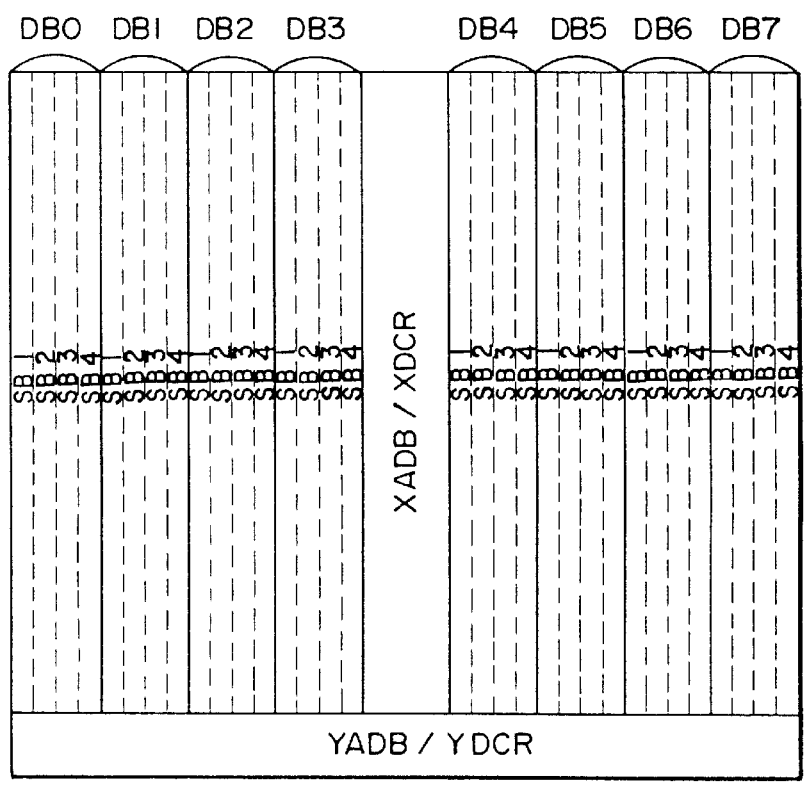

Another embodiment will be described, which is the same nonvolatile memory as in the embodiment shown in FIGS. 17 and 18. In order to reduce the charging current to the memory array and the discharging current from the memory array, the memory cell array has k memory sub-blocks (k=2, 3, . . . ) of memory cell groups arranged in the column direction in each of the data blocks DB0 to DB7 mentioned in the previous embodiment as shown in FIG. 20. This memory array can be all erased. In FIG. 20, 8 sub-blocks represented by the same reference, for example, SB1 are a group of memory cells which can be specified by the same address.

Figure 21:
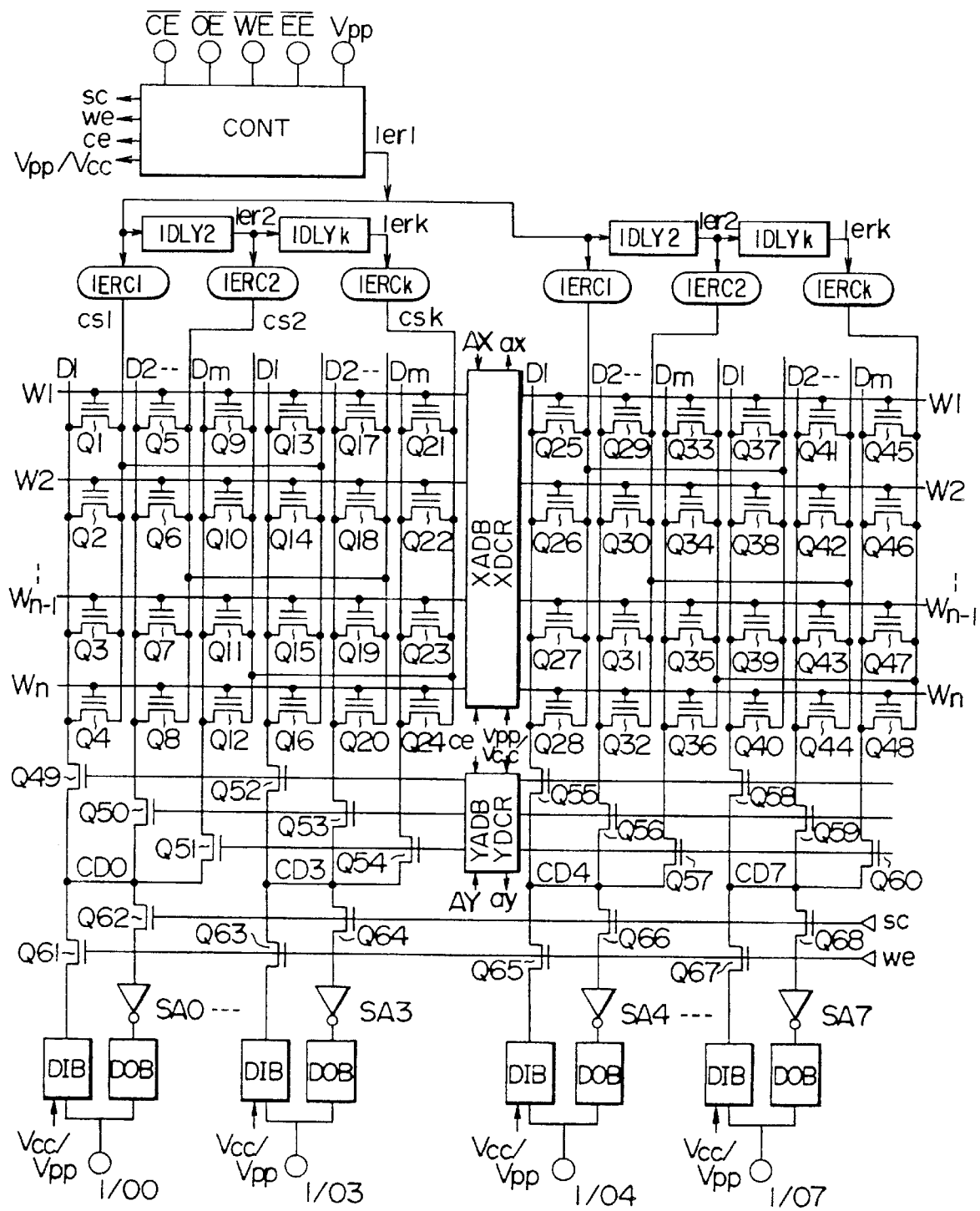
FIGS. 21, 23, 25, and 27 to 33 are circuit diagrams of other embodiments of a semiconductor memory device of this invention.

FIG. 21 is a circuit diagram of the memory array of the semiconductor nonvolatile memory of this embodiment.

In FIG. 21, for example, the memory cell group belonging to the first sub-blocks SB1 includes Q1 to Q4, Q13 to Q16, Q25 to Q28 and Q37 to Q40 connected to the data line D1. In FIG. 21, while the memory cell group connected to one of the data lines D (D1, D2, . . . ) of each data block DB (DB0, DB1, . . . ) is called the divided sub-block SB (SB1, SB2, SBk), several memory cell groups connected to two or more data lines D of each data block DB may be called as the sub-block. Each of the sub-blocks SB, as mentioned with reference to FIGS. 17 and 18, is connected to the information erase signal generation circuit 1ERC1 to 1ERCk each shown in FIG. 19. The control signals from the control circuit CONT and the delayed control signals delayed through delay circuits lDLY2, lDLY3, . . . are supplied to the information erase signal generation circuits 1ERC1, 1ERC2, . . . , 1ERCk) provided for each memory sub-block.

The operations for simultaneous electrical erasing, writing and reading are the same as in FIGS. 17 and 18.

Figure 22:
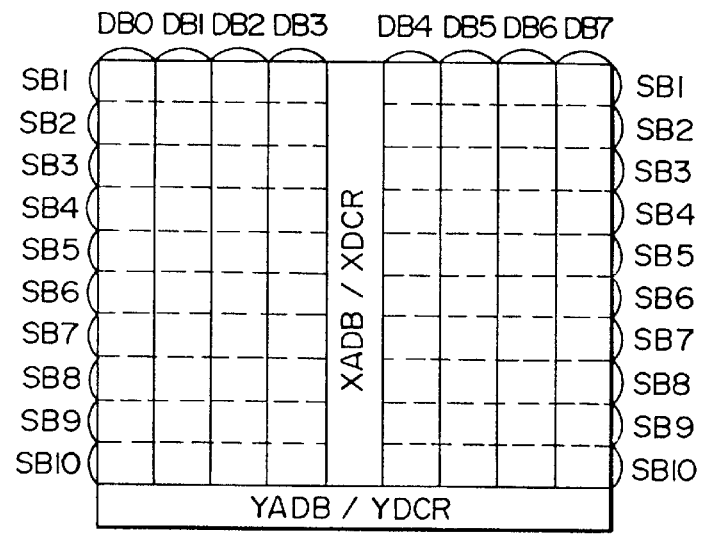

Still another embodiment of this invention will be described which is the same semiconductor nonvolatile memory as in FIGS. 17 and 18. In order to reduce the charging current to and discharging current from the memory array, each of the memory blocks DB0 to DB7 is divided into k (k=2, 3, . . . ) memory sub-blocks of memory cell groups in the row direction as shown in FIG. 22, so that the whole memory array can be erased.

Figure 23:
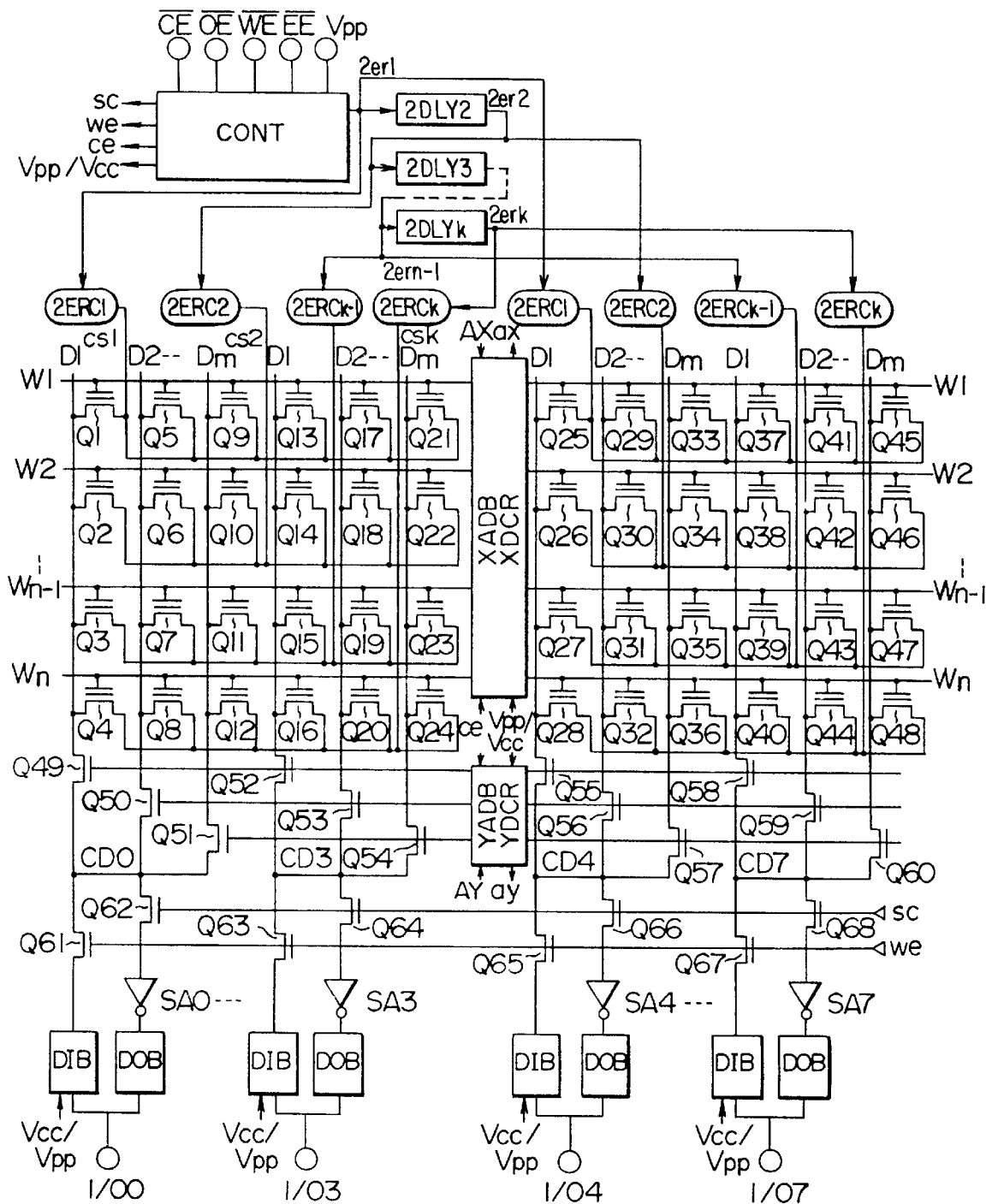

FIG. 23 is a circuit diagram of the memory array of the semiconductor nonvolatile memory of this embodiment.

In FIG. 23, the memory cell group of, for example, the first sub-block SB1 includes Q1, Q5, Q9, Q13, Q17, Q21, Q25, Q29, Q33, Q37, Q41 and Q45 connected to the word line W1. In FIG. 23, while the memory group connected to one word line W of each data block DB is called the divided block SB, several memory cell groups connected to two or more word lines W of each data block DB may be called so. As in the embodiment shown in FIGS. 17 and 18, each divided sub-block SB is connected to the information erase signal generation circuit ERC1 to ERCn shown in FIG. 19. The control signal from the control circuit CONT and the delayed control signals 2er1, 2er2, . . . 2erk delayed through delay circuits 2DLY2, 2DLY3, . . . are supplied to information erase signal generation circuits 2ERC1, 1ERC2, . . . 2ERCk provided for each memory sub-block, respectively.

The operations for simultaneous electrical erasing, writing and reading of the memory array are the same as in the embodiment shown in FIGS. 17 and 18.

Figure 3:
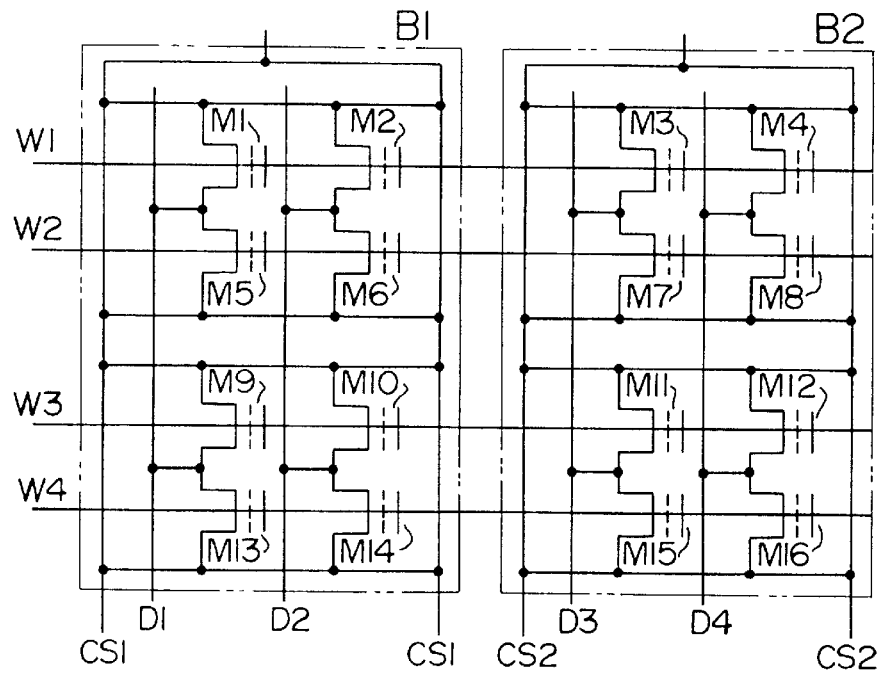
FIGS. 3 to 4 are schematic circuit diagrams of memory cell arrays.
Figure 4:
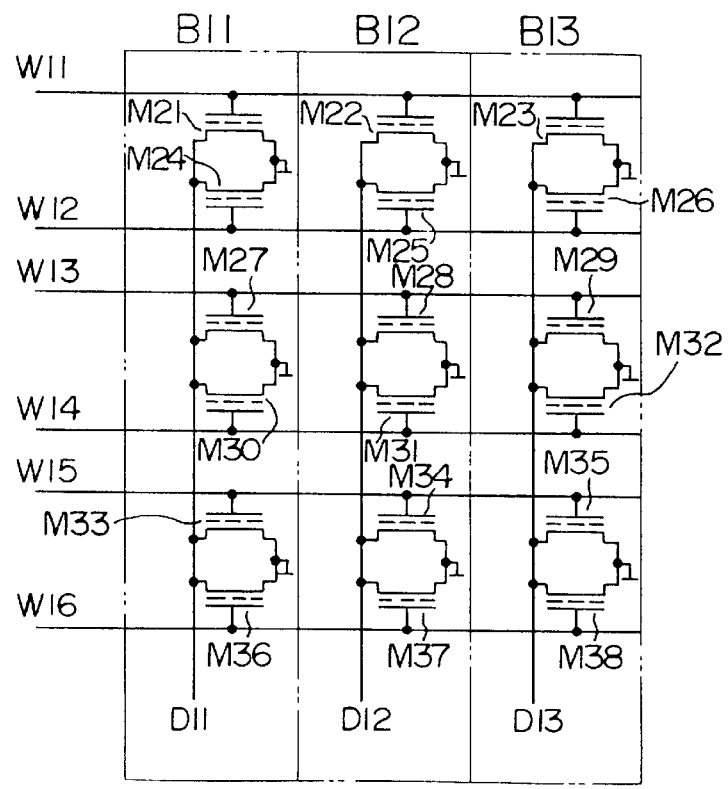

In this embodiment, the memory cells connected to the same word line belong to the same memory sub-block, and thus the program disturbance time mentioned with reference to FIGS. 3 to 5, and the length of the wiring described with reference to FIG. 6 are reduced.

Figure 24:
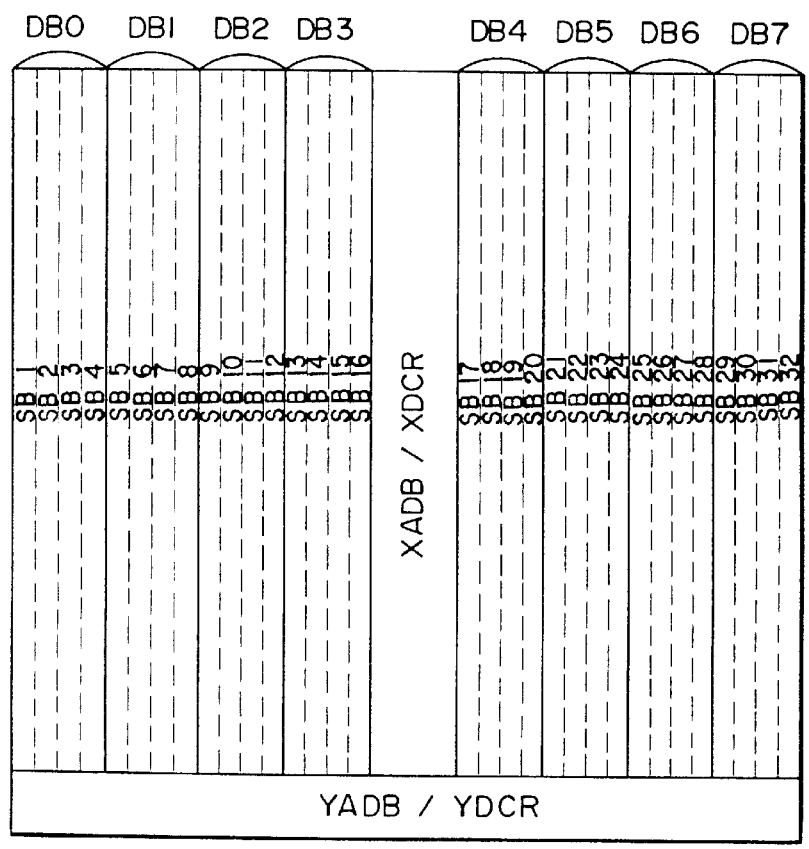

A further embodiment of the invention will be described which is based on the semiconductor nonvolatile memory in FIGS. 17 and 18. In order to reduce the charging current to and discharging current from the memory array, the k (k=1, 2, . . . ) divided sub-blocks SB1 to SB32 are arranged in arbitrary column directions different from the data block DB shown in FIG. 24 so that the whole memory array can be erased. The data blocks are each divided in the same way as in the embodiment of FIGS. 20 and 21, but the voltage upon erasing is differently applied.

Figure 25:
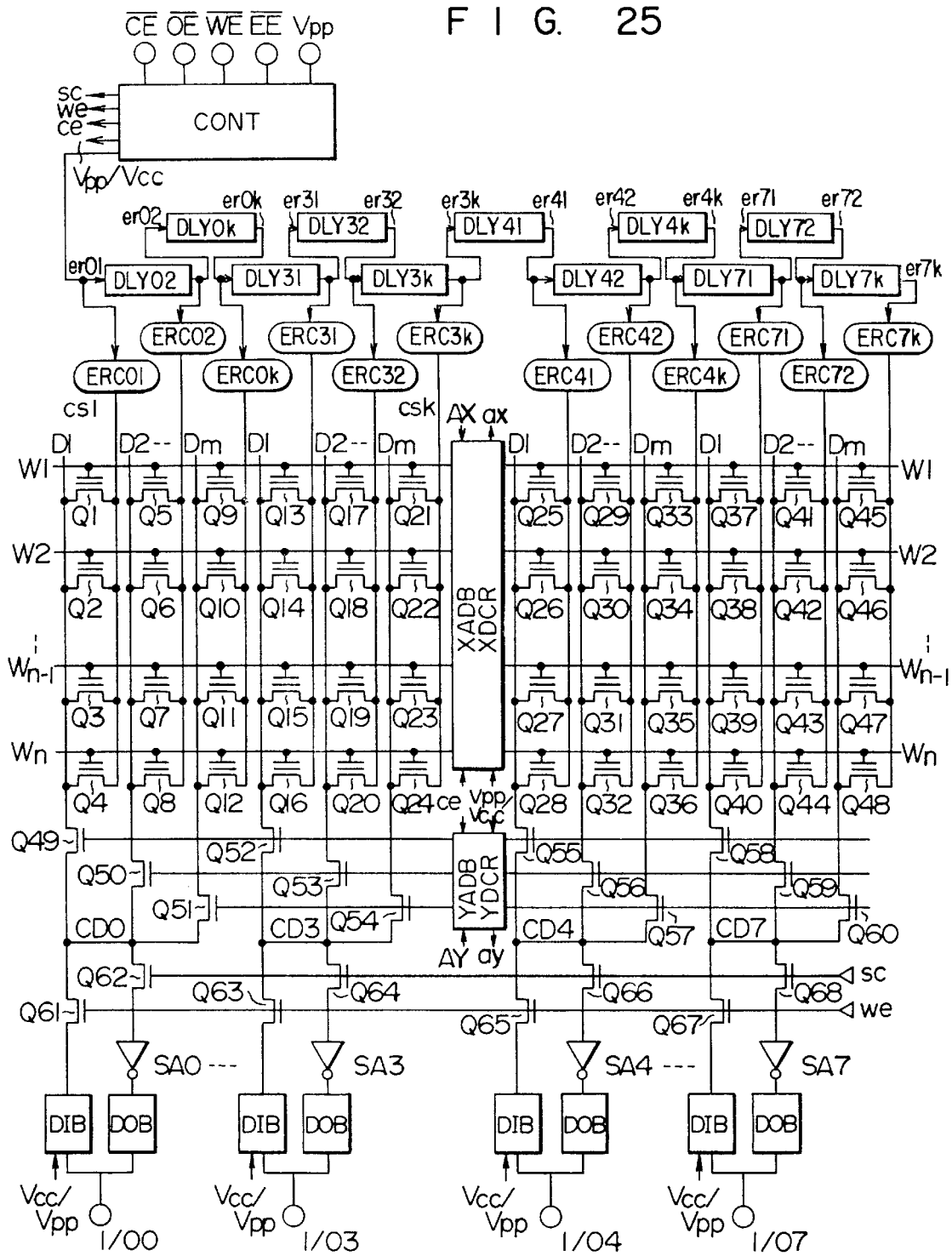

FIG. 25 is a circuit diagram of the memory array of the semiconductor nonvolatile memory of this embodiment.

In FIG. 25, the memory cell group of, for example, first divided sub-blocks SB1 includes memory cells of Q1 to Q4 connected to the data lines D1 of the data block DB0. In FIG. 25, while the memory cell group connected to one data line D is called the divided sub-block SB, several memory cell groups connected to two or more data lines D may constitute the sub-block. As in the embodiment shown in FIGS. 17 and 18, the sub-blocks SB are each connected to the information erase signal generation circuits ERC01, ERC02, . . . , ERC7k. The control signal from the control circuit CONT and the delayed control signals er02, er03, . . . , erok delayed through the delay circuits DLY02, DLY03, . . . , DLY7k are supplied to the information erase signal generation circuits ERC01, ERC02, . . . , ERC0K, respectively.

The operations of simultaneous electrical erasing, writing and reading in the memory array are the same as in the embodiment shown in FIGS. 17 and 18.

A still further embodiment of this invention will be described which is the same semiconductor nonvolatile memory device as in FIGS. 17 and 18. In order to reduce the charging current to and discharging current from the memory array, the memory blocks DB1 to DB7 are respectively divided into k memory sub-blocks (k=1, 2, . . . ) of memory cell groups in the column direction as shown in FIG. 26, so that part or all of the memory array can be erased. The part to be erased is specified by the column address signal ay from the external AY.

Figure 27:
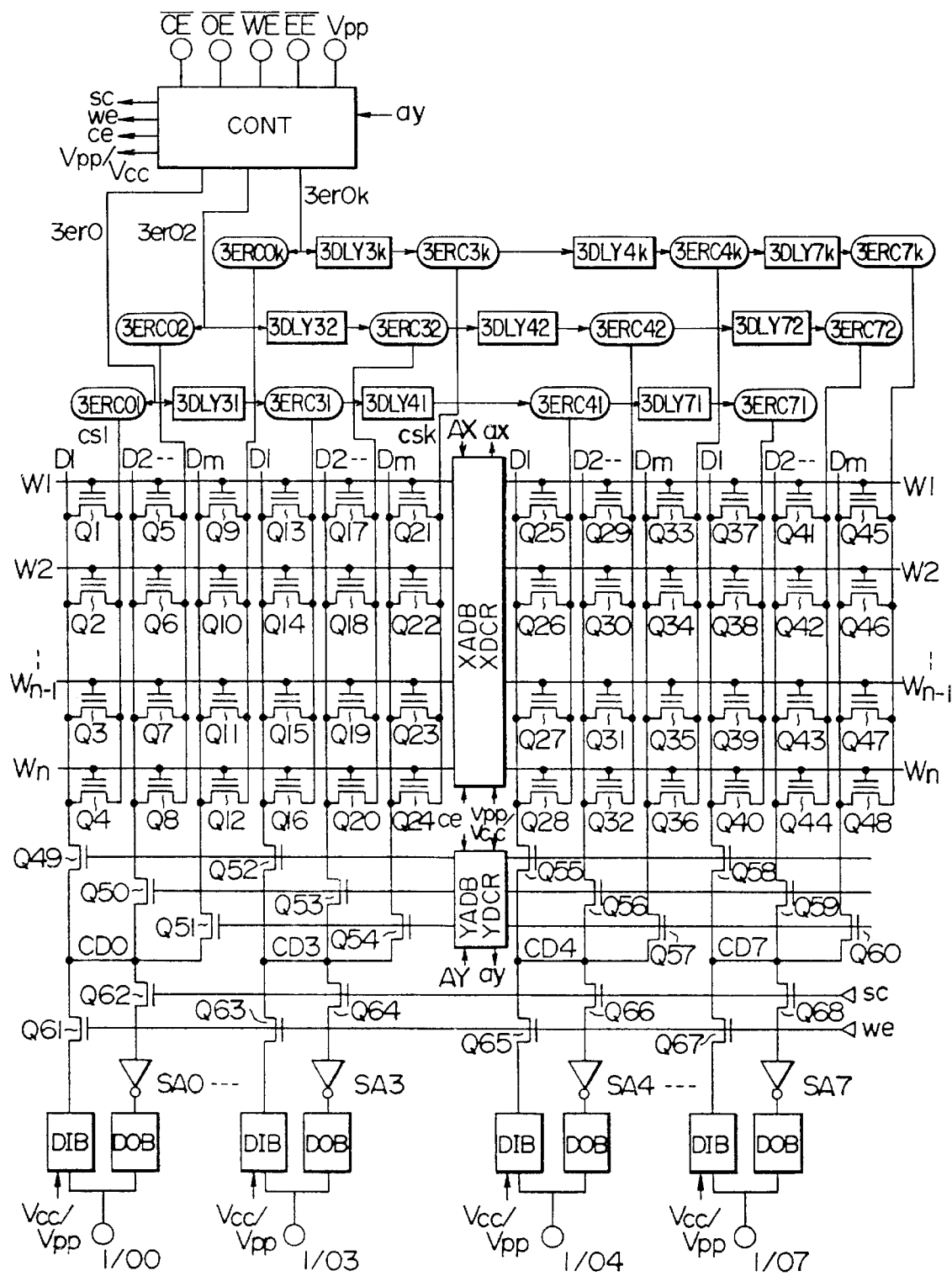

FIG. 27 is a circuit diagram of the memory array of the semiconductor nonvolatile memory device of this embodiment.

In FIG. 27, the memory cells belonging to the data lines represented by the same reference, for example, Q1 to Q4, Q13 to Q16, Q25 to Q28, Q37 to Q40 are selected by the column address signal ay and erased. At this time, only the erase control signal 3er01 becomes a high level, and erase control signals 3er02 to 3er0k are at a low level, respectively. As shown in FIG. 15, the 3ERC01 generates a high voltage pulse, starting to erase the memory cells Q1 to Q4. Then, the control signal passed through the delay circuit 3DLY31 is transmitted to the erase control circuit 3ERC31 for controlling the sources of the memory cells Q13 to Q16, starting to erase the memory cells Q13 to Q16. In a similar manner, the memory cells Q25 to Q28 and Q37 to Q40 start erasing. Also, erasing is stopped as in FIG. 15.

In FIG. 27, while the divided sub-block B is treated as the memory group connected to one data line D, and connected to the erase control circuit 3ERC01 to 3ERC7k shown in FIG. 19, the divided sub-block may be treated as several memory cell groups connected to two or more data lines D.

With this arrangement, any memory cell group connected to the data line D of the same address can be erased. In other words, various different parts of the memory array can be erased by the combination of the erase control signals 3er01 to 3er0k.

The operations of electrical erasing, writing and reading in the memory array are the same as in the embodiment shown in FIGS. 17 and 18.

A further embodiment of this invention will be described which is the same semiconductor nonvolatile memory device as in FIGS. 17 and 18. In order to reduce the charging current to and discharging current from the memory cell array, the data block DB is divided into k (k=1, 2, . . . ) memory sub-blocks of memory cell groups in the column direction as shown in FIG. 26 so that one or a plurality of the data blocks DB0 to DB7 can be erased.

Figure 28:
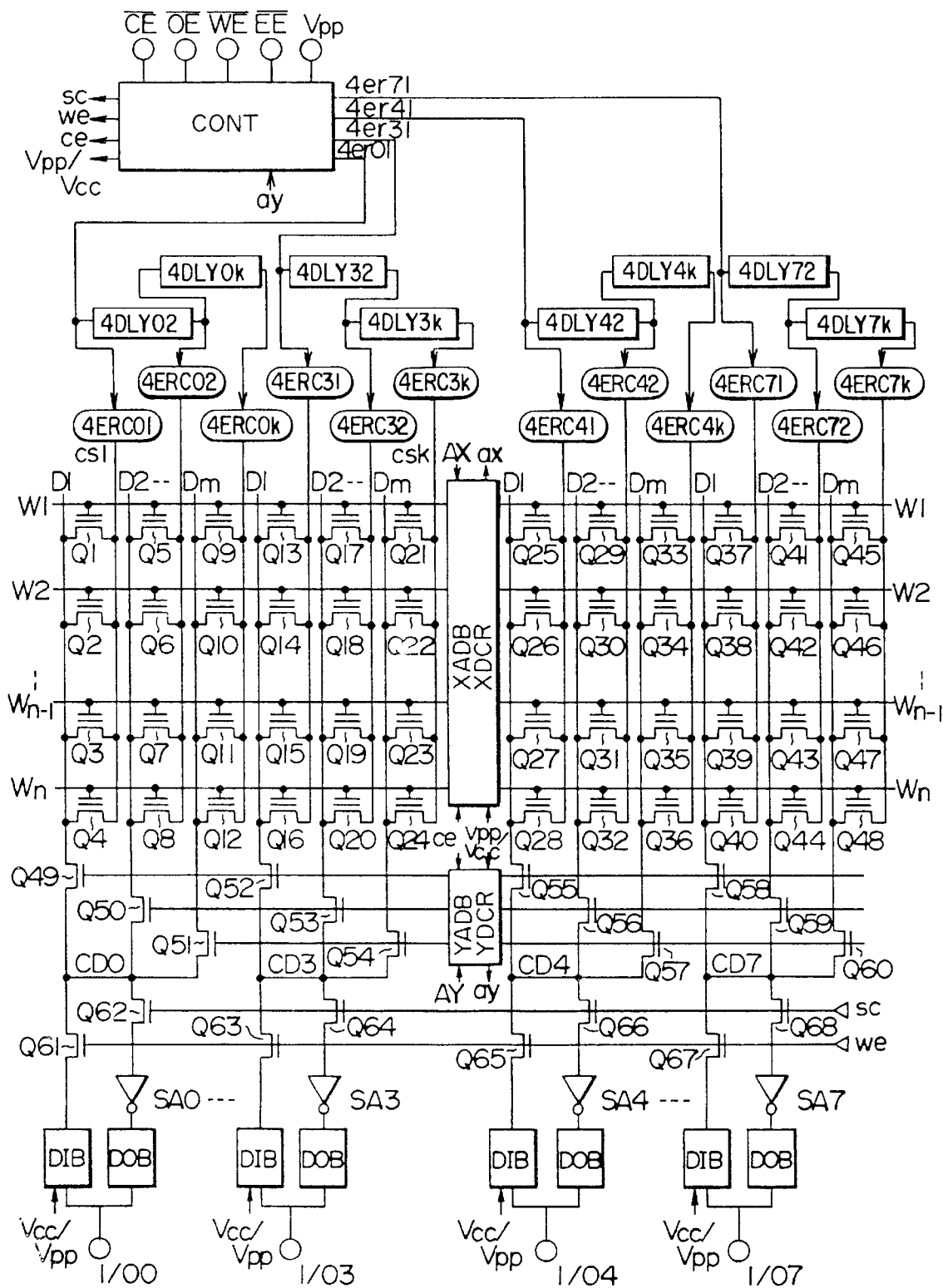

FIG. 28 is a circuit diagram of the memory array of the semiconductor nonvolatile memory of this embodiment.

In FIG. 28, the data block DB to be erased is specified by the address input signal ay. If the data block DB0 is erased, only the erase control signal 4er01 is made a high level, and the erase control signals 4er11, 4er21, 4er71 remain at a low level. In this case, the memory cell group of each divided sub-block SB includes Q1 to Q4 connected to the data line D1 of the data block DB0, Q5 to Q8 connected to the data line D2, and Q9 to Q12 connected to the data line Dm. In FIG. 28, while the memory cell group connected to one data line D is treated as the divided sub-block and connected to the information erase signal generation circuit ERC01 to ERC7k, several memory cell groups connected to two or more data lines D may be treated as the divided sub-block DB.

While in FIG. 28, one data block DB is erased, a plurality of data blocks may be erased. In this case, a plurality of blocks are selected by the address ay. With this arrangement, an arbitrary number of data blocks DB can be erased. In other words, various different parts of the memory array can be erased by the combination of the erase control signals 4er11, 4er21, . . . , 4er71.

The operations of electrically erasing, writing and reading in the memory array are the same as in FIGS. 17 and 18.

Another embodiment of this invention will be mentioned which is based on the semiconductor nonvolatile memory device in FIGS. 17 and 18. In order to reduce the charging current to and discharging current from the memory array, the divided memory sub-blocks SB1 to SB10 are arranged in the row direction as shown in FIG. 22 so that part or all of the memory array can be erased.

Figure 29:
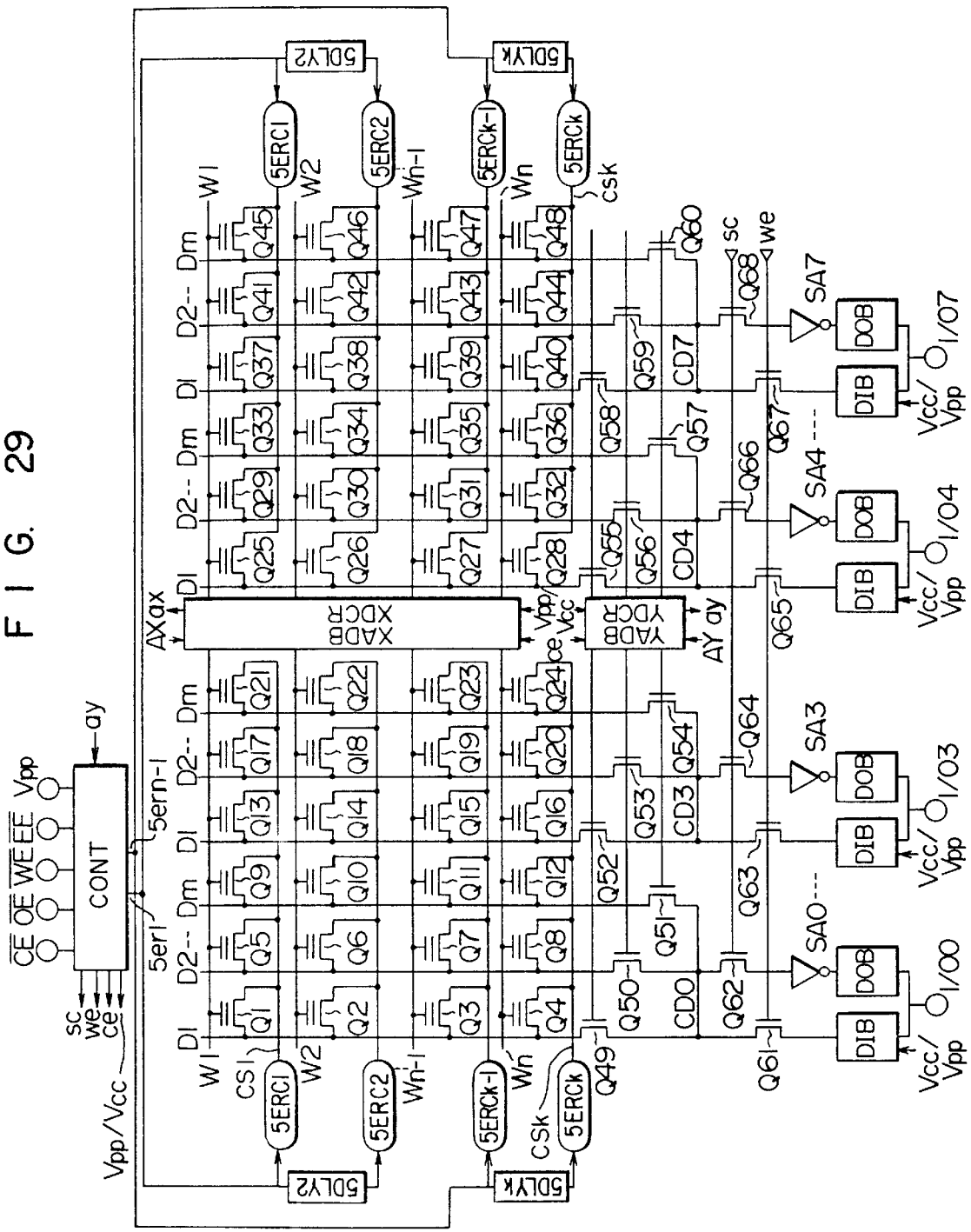

FIG. 29 is a circuit diagram of the memory array of the semiconductor nonvolatile memory device of this invention.

In FIG. 29, the memory cells, for example, Q1, Q2, Q5, Q6, Q9, Q10, Q13, Q14, Q17, Q18, Q21, Q22, Q25, Q26, Q29, Q30, Q33, Q34, Q37, Q38, Q41, Q42, Q45 and Q46 belonging to the word lines W selected by the row address signal ax are selected and erased. At this time, the erase control signal 5er1 is made a high level, and the erase control signal 5ern-1 is at a low level. In this case, the memory cell group of each divided sub-block SB is divided into the memory cell group of which the gates are connected to the word line W1, and the memory cell group of which the gates are connected to the word line W2, these two blocks being erased as in FIG. 15. In FIG. 29, while the memory cell group connected to one word line W is treated as the divided sub-block and connected to the erase control circuit 5ERC1 to 5ERCk, and the range to be erased is the memory group connected to two word lines W, the divided sub-block and the range to be erased are limited thereto, or several memory cell groups connected to two or more word lines W may be treated as the divided sub-block and such range may be erased.

With such arrangement, the memory cell group connected to an arbitrary number of word lines W can be erased. In other words, various different parts of the memory array can be erased by the combination of the erase control signals 5er1 to 5ern-1.

The operations of electrical erasing, writing and reading are the same as in FIGS. 17 and 18.

In this embodiment, since the memory cells connected to the same word line belong to the same memory sub-block, the program disturbance time mentioned with reference to FIGS. 3 to 5 and the length of the wiring described with reference to FIG. 6 are reduced.

An even further embodiment of this invention will be described in which the arrangement of the divided block is the same as shown in FIGS. 17 and 18, but the high voltage is applied in a different way.

Figure 30:
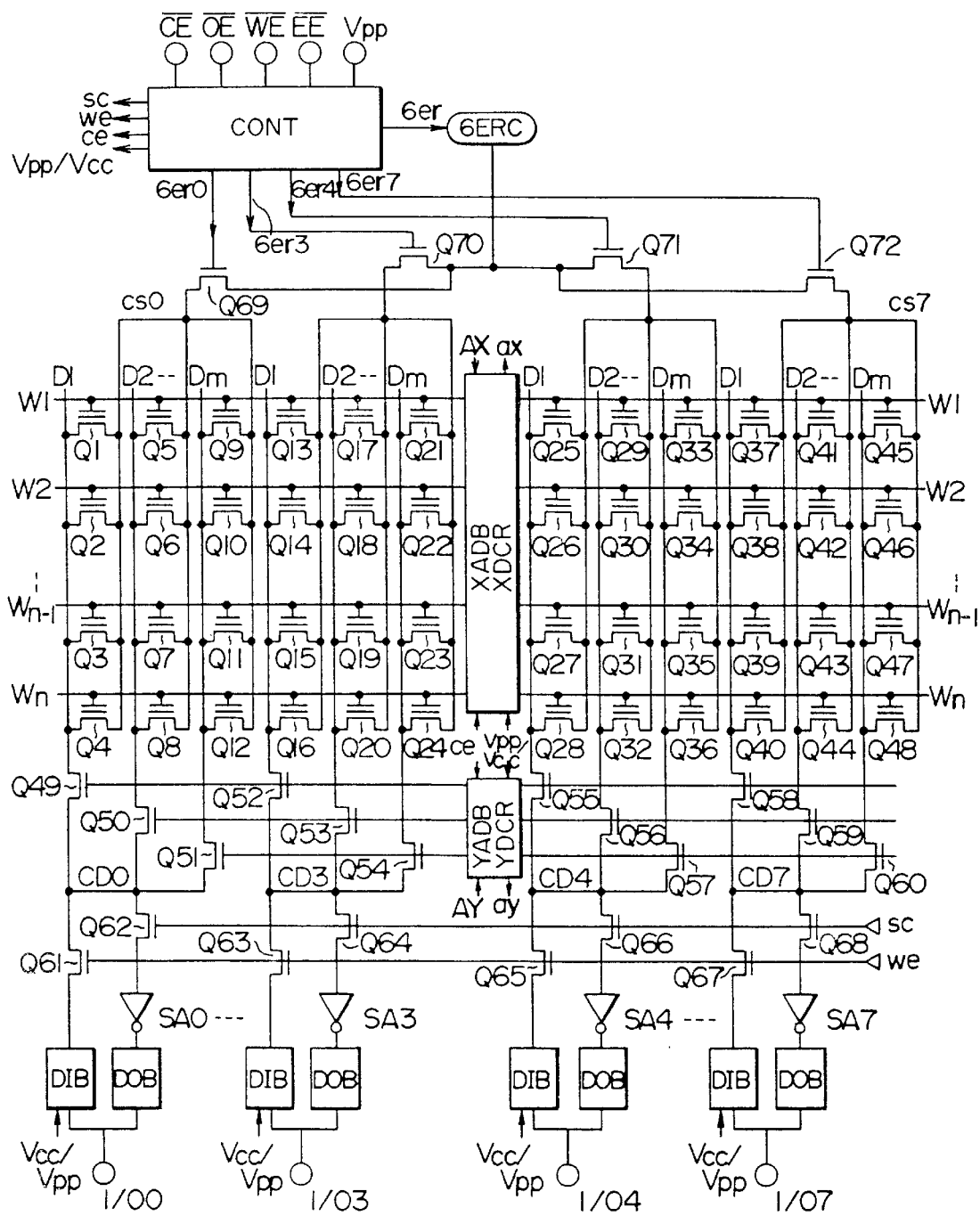

FIG. 30 is a circuit diagram of the memory array of the semiconductor nonvolatile memory device of this embodiment.

In FIG. 30, the erase control circuit 6ERC shown in FIG. 19 is connected to the memory cell group of each data block DB0 to DB7 through the MOSFETs Q69 to Q72 which are turned ON by the switch signals 6er0 to 6er7. The threshold voltages of the MOSFETs Q69 to Q72 are selected to be low values to prevent the erase voltage Vpp from being effectively reduced or the MOSFETs Q69 to Q72 can, alternatively, be of the p-channel conductivity type.

Upon erasing, the input signal 6er to the erase control circuit 6ERC is made a high level by the column address signal ay.

Figure 16:
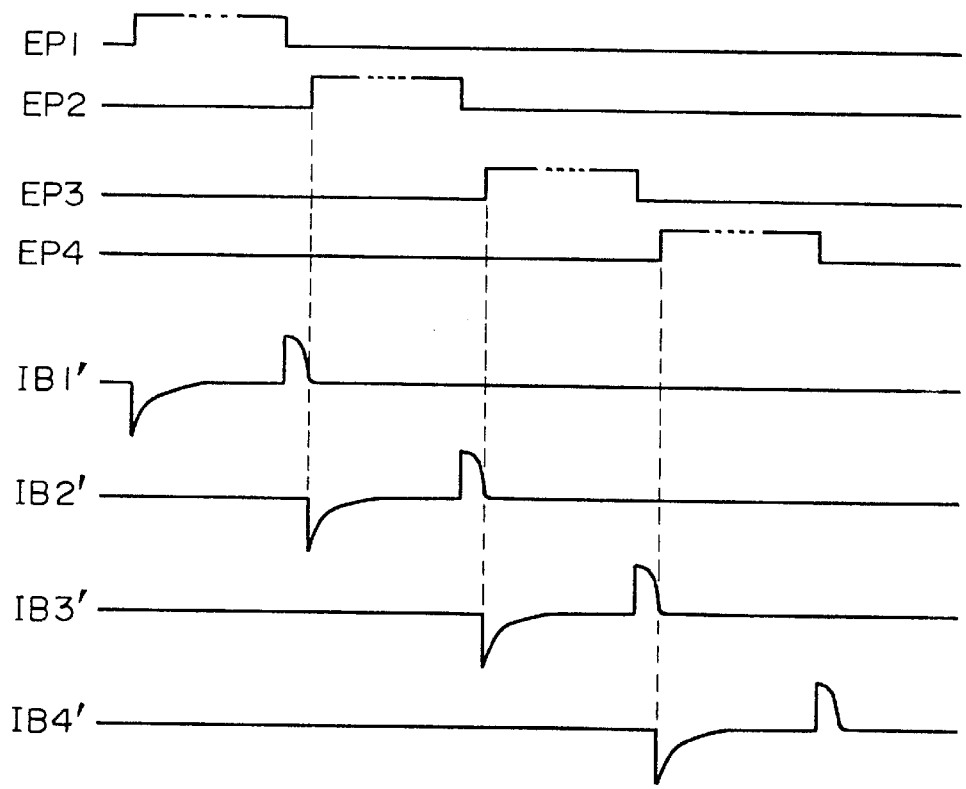

As to the time of erasing the memory cell group of each data block DB, the next or succeeding data block starts erasing when the discharging current from the previous data block is sufficiently reduced, in accordance with the relation between the high voltage waveform EP to be applied and the charging and discharging current waveform IB shown in FIG. 16. The timing control circuit CONT generates the erase switch signals 6er0 to 6er7 for controlling the timings of the erase operation. With this arrangement, the memory array can be all erased at a time.

The operations of electrically erasing, writing and reading in the memory array are the same as in FIGS. 17 and 18.

A still further embodiment of this invention will be described in which the arrangement of the divided block is the same as in FIGS. 20 and 21, but the high voltage is applied in a different way.

Figure 31:
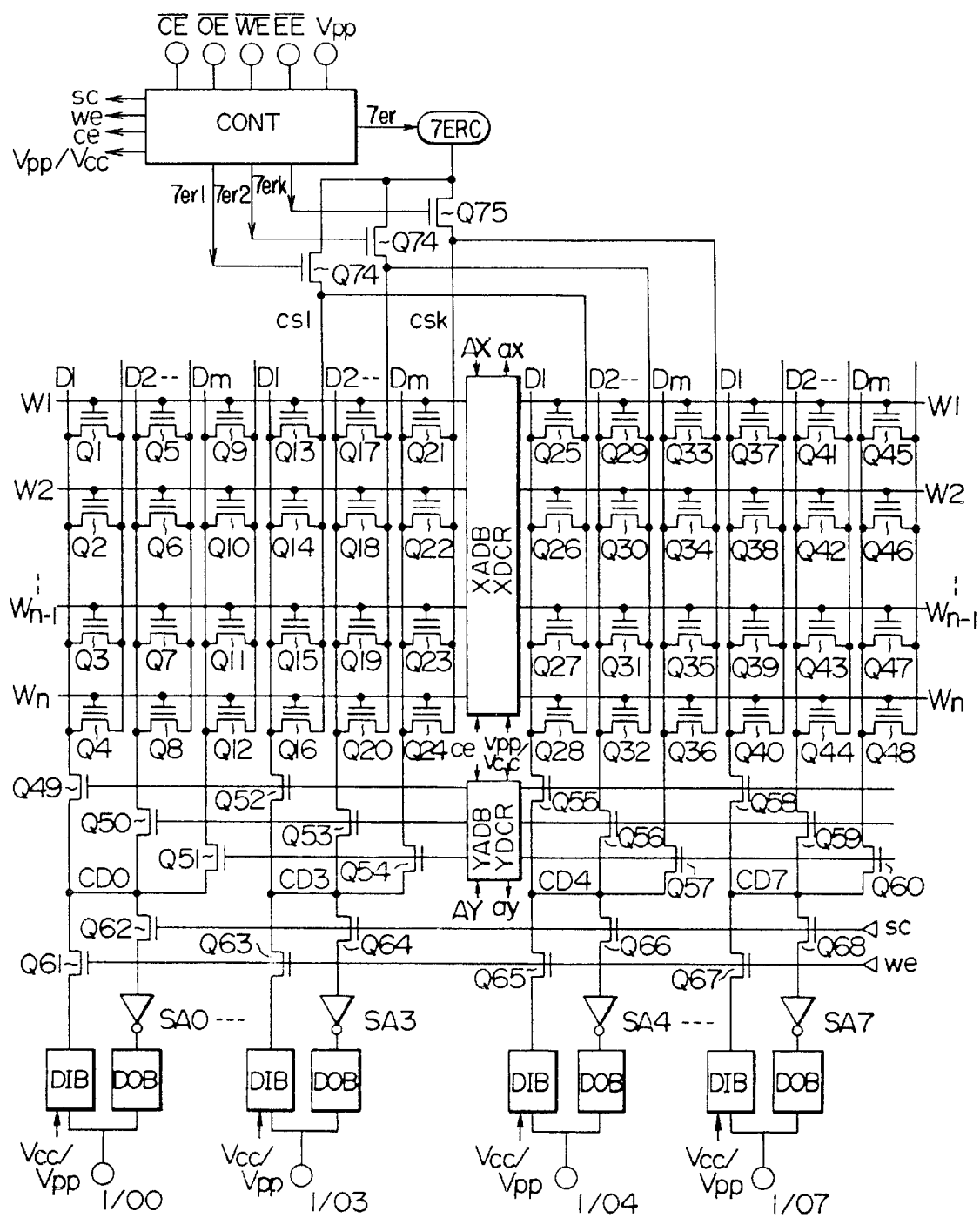

FIG. 31 is a circuit diagram of the memory array of the semiconductor nonvolatile memory device of this embodiment.

In FIG. 31, the information erase signal circuit 7ERC shown in FIG. 19 is connected to the memory cell group which is connected to the data lines D1 to Dm, through the MOSFET Q73 to Q75 which are made on by the switch signals er1 to erk. The threshold voltages of the MOSFETs Q73 to Q75 are selected to be small values to prevent the erase voltage Vpp from being, effectively, reduced or the MOSFETs Q73 to Q75 can, alternatively, be of the p-channel conductivity type.

Upon erasing, the input signal 7er to the erase control circuit 7ERC is made a high level. The timing control circuit CONT produces switch signals 7er1 to 7erk as the gate input signals to the MOSFETs Q73 to Q75 which specify the memory cell group to be erased.

As to the time of erasing the memory cell group connected to each data line D1 to Dm, the next or succeeding data block starts erasing when the discharging current from the previous data block is sufficiently reduced, in accordance with the relation between the high voltage waveform EP to be applied and the charging and discharging current waveform IB shown in FIG. 16. The timing control circuit CONT generates the erase switch signals 7er1 to 7erk for controlling the timings of the erase operation. With this arrangement, the memory cells of the memory cell group of an arbitrary number of data lines D can be erased. In other words, it is possible to realize a partial erasing of the various data blocks DB including erasing of the entire memory array in accordance with the combination of the address signals.

The operations of electrically erasing, writing and reading in the memory array are the same as in FIGS. 17 and 18.

An additional embodiment of this invention will be described in which the arrangement of the divided block is the same as in FIGS. 22 and 23, but the high voltage is applied in a different way.

Figure 32:
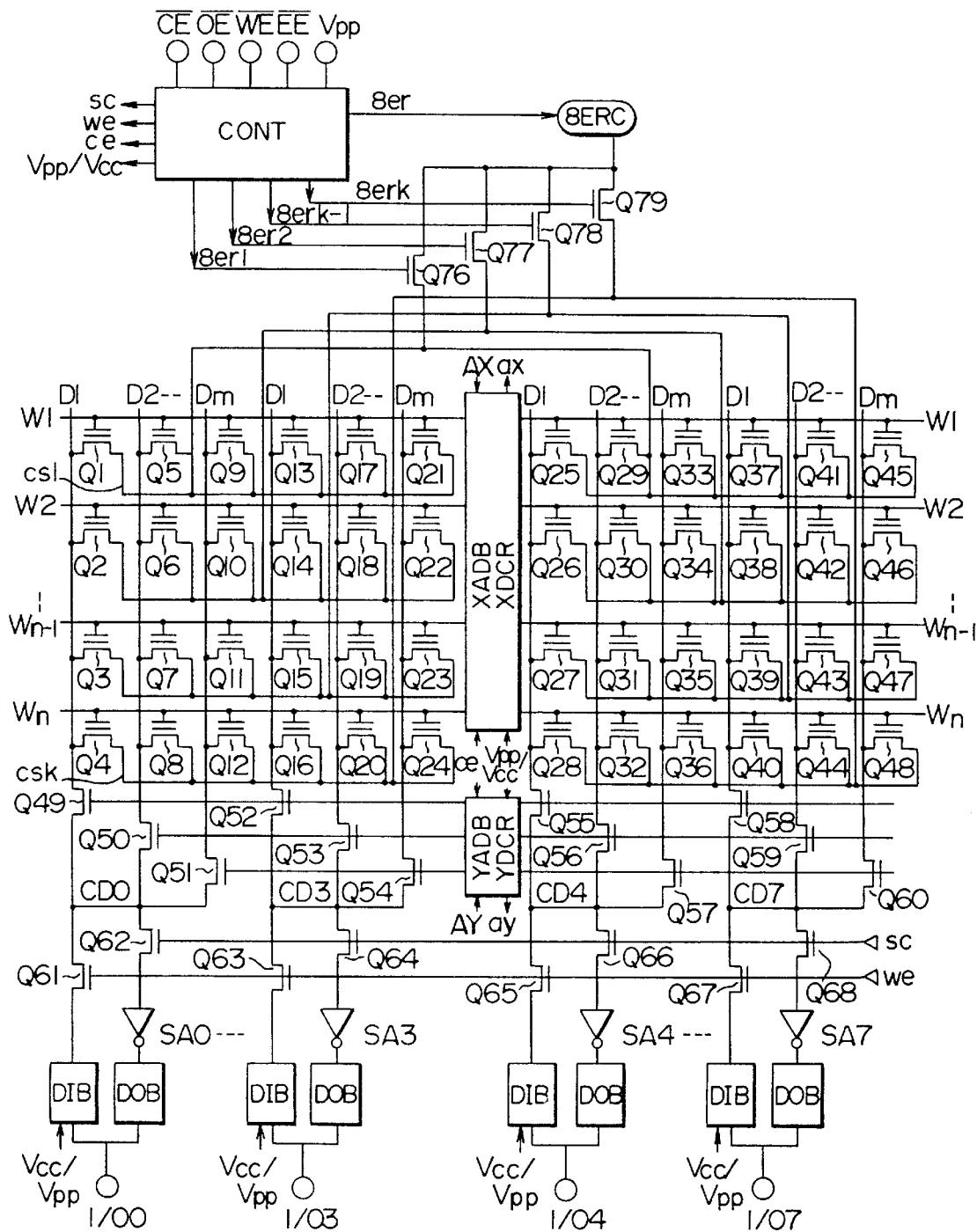

FIG. 32 is a circuit diagram of the memory array of the semiconductor nonvolatile memory device of this embodiment.

In FIG. 32, the erase control circuit 8ERC shown in FIG. 19 is connected to the memory cell group connected to the word lines W1 to Wn through the MOSFETs Q76 to Q79 which are turned ON by the switch signals 8er1 to 8erk, which will be described later. The threshold voltages of the MOSFETs Q76 to Q79 are selected to be small values to prevent the erase voltage Vpp from being, effectively, decreased or the MOSFETs Q76 to Q79 can, alternatively, be of p-channel conductivity type.

Upon erasing, the input signal 8er to the erase control circuit 8ERC is made a high level. The timing control circuit CONT produces switch signals 8er1 to 8erk as the gate input signals to the MOSFETs Q76 to Q79 for specifying the memory cell group to be erased.

As to the time of erasing the memory cell group connected to each word line W1 to Wn, the next or succeeding data block starts erasing when the discharging current from the previous data block is sufficiently reduced, in accordance with the relation between the high voltage waveform EP to be applied and the charging and discharging waveform IB shown in FIG. 16. The timing control circuit CONT generates the switch signals 8er1 to 8erk for controlling the timings of the erasing operation. Just as in FIGS. 17 and 30, this arrangement is able to erase the memory cells of the memory cell group of an arbitrary number of word lines W. In other words, it is possible to realize a partial erasing of various different data blocks DB including erasing of the entire memory array in accordance with the combination of the address signals.

The operations of electrical erasing, writing and reading in the memory array are the same as in FIGS. 17 and 18.

Additionally, an even further embodiment of this invention will be described in which the arrangement of the divided block is the same as in FIGS. 26 and 27 but the high voltage is applied in a different way.

Figure 33:
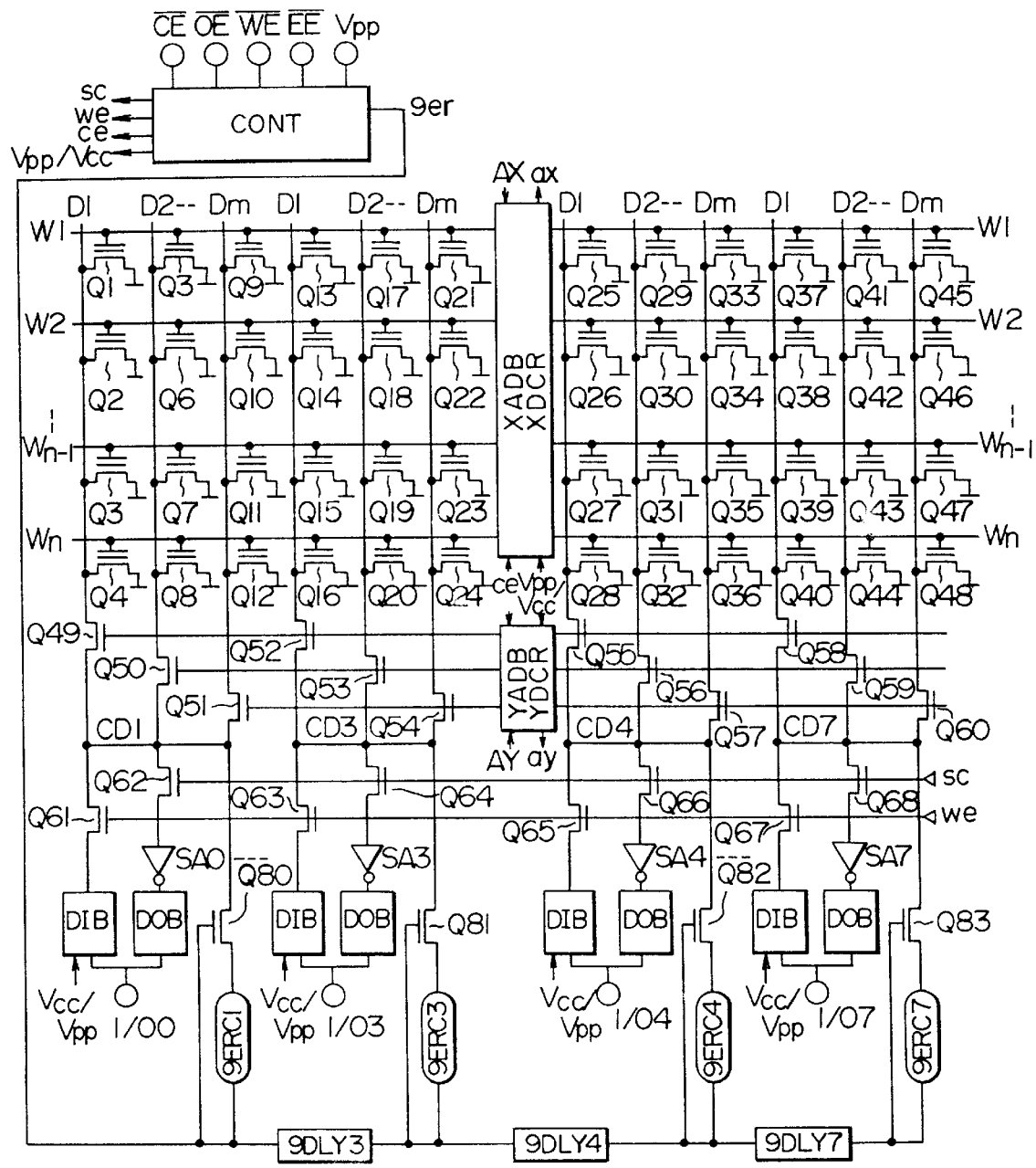

FIG. 33 is a circuit diagram of the memory array of the semiconductor nonvolatile memory device of this invention.

In FIG. 33, ground potential for circuits is always applied to the sources of the memory cells, and erasing is made on the data line side of the drain. The common data lines CD to the data lines Dl to Dm of each data block DB are connected to the erase control circuits 9ERC1 to 9ERC7 shown in FIG. 19 through the MOSFETs Q80 to Q83 which are turned ON by the erase control signal 9er and the delayed control signals 9er2 to 9er7 which are produced by delaying that control signal. The threshold voltages of the MOSFETs Q49 to Q60 and Q80 to Q83 are selected to be small values to prevent the erase voltage Vpp from being reduced or the MOSFETs Q49 to Q60 and MOSFET Q80 to Q83 are, alternatively, of the p-channel conductivity type.

Upon erasing, the input signal 9er to the information erase signal generation circuit 9ERC1 is made a high level. The row decoder circuit XDCR sets all the word lines at the nonselection level, such as, ground potential. At this time, the column address signal AY from the external is supplied to the column decoder circuit YDCR, thus specifying a selection signal to the memory array group to be erased, to select at least one of the MOSFETs Q49 to Q60 and to turn it ON.

As to the erase time for the memory cell group connected to the respective data lines Dl to Dm, when the discharging current from the previous data block DB is decreased enough, the next or succeeding data block DB starts erasing, in accordance with the relation between the high voltage wave EP to be applied and the charging and discharging current waveform IB. The timing control circuit CONT generates a selection signal to the memory array group to be erased, in accordance with the control signal from the external or the inside. With this arrangement, it is possible to erase the memory cells of a memory cell group connected to an arbitrary number of data lines D. In other words, by the combination of address signals it is possible to realize various ways of partially erasing of data block DB including erasing of the entire memory array.

The operation for electrical erasing, writing and reading of memory array is the same as in the embodiment shown in FIGS. 17 and 18.

According to the embodiments mentioned above with reference to FIGS. 17 to 33, the memory array of the electrically erasable semiconductor nonvolatile memory device is divided into two or more blocks smaller than a memory array part to be erased, and the divided memory blocks are sequentially electrically erased in which case it is possible to reduce the charging current to and discharging current from the memory array in the erase mode.

What is claimed is:

1. An electrically erasable semiconductor nonvolatile memory device comprising:

a plurality of nonvolatile memory cells formed in a semiconductor substrate and arranged in an array of rows and columns, each of said memory cells including a field-effect transistor element having a floating gate, a control gate and drain and source regions;

word line conductors extending in a first direction substantially parallel with said rows; and data line conductors extending in a second direction substantially parallel with said columns, the control gates and drain regions of said memory cells being connected with said word line and data line conductors, respectively, to form said array, said word line conductors and said data line conductors being responsive to a row decoder and a column decoder, respectively, and said array of nonvolatile memory cells consisting of a plurality of memory blocks, wherein each of said memory blocks includes at least one word line conductor and the memory cells connected thereto and a common source conductor, each common source conductor being connected to a corresponding one of plural erasing circuits and being connected to apply an erasing voltage, independently of said row decoder, to the source regions of the field-effect transistor elements of the memory cells in a corresponding one of said memory blocks and extending in said first direction substantially parallel with said word line conductors, each common source conductor belonging to a respective one of said memory blocks and serving, in an erasing operation, as a path for electrons to be extracted from the floating gates of the field-effect transistor elements of the memory cells in the memory block with which the common source conductor corresponds to, and each word line conductor belonging to a respective one of said memory blocks, and wherein simultaneous erasure of the memory cells connected to said at least one word line in a selected memory block is effected by providing a potential difference between that of said common source conductor, supplied with the erasing voltage, and each word line, supplied with a predetermined voltage, corresponding to that memory block and keeping said data line conductors from being supplied with a power potential, in an erase mode.

2. An electrically erasable semiconductor nonvolatile memory device according to claim 1, wherein said first decoder circuit means and the information erasure signal applying means cover plan view areas of the main surface of said semiconductor substrate, respectively, adjacent opposing end sides, which are directioned substantially parallel with said columns, of a rectangular plan view area of said memory cell array, and wherein said second decoder circuit means covers a plan view area adjacent the plan view area of said first decoder circuit means in the column direction.

3. An electrically erasable semiconductor nonvolatile memory device comprising:

a semiconductor substrate having a main surface;

a memory cell array having a plurality of nonvolatile memory cells arranged in rows and columns, each of said memory cells including a field-effect transistor element having a first gate electrode, drain and source regions formed at the main surface of said semiconductor substrate and a second gate electrode, said second gate electrode being interposed between said first gate electrode and that part of the main surface of said semiconductor substrate, associated with each said field-effect transistor element, which lies between said drain and source regions;

first decoder circuit means for controlling said first gate electrode of the field-effect transistor elements of said memory cells;

first conductors formed over said semiconductor substrate and extended as word lines, respectively, in a first direction substantially parallel with said rows, the first gate electrodes of the field-effect transistor elements of memory cells on one row being connected in common with a respective one of said first conductors;

second conductors formed over said semiconductor substrate and extended in a second direction substantially parallel with said columns, the drain regions of the field-effect transistor elements of memory cells on one column being connected in common with a respective one of said second conductors;

second decoder circuit means for controlling accessing of said second conductors through ON and OFF control of a switching circuit;

third conductors formed over the main surface of said semiconductor substrate and extended in said first direction so as to be substantially parallel with said rows, the source regions of the field-effect transistor elements of at least one row of memory cells being connected in common with a respective one of said third conductors; and means for selectively applying to said third conductors an information erasure signal, independently of said first decoder circuit means, in which simultaneous erasure of the memory cells connected to one or more word lines is effected by providing a potential difference between that of a third conductor, supplied with said information erasure signal, and said one or more word lines, supplied with a predetermined voltage, corresponding thereto and by said second decoder circuit means keeping said switching circuit in an OFF state, in an erase mode, such that the drain regions are not supplied with a power potential.

4. An electrically erasable semiconductor nonvolatile memory device according to claim 3, wherein the signal applying means for effecting electrical erasure includes a plurality of information erasure signal generating circuits in which one is provided for each of said third conductors, and means for controlling said information erasure signal generating circuits so that at least two of said information erasure signal generating circuits are operated with a time delay.

5. A substantially rectangular semiconductor chip having an electrically erasable semiconductor nonvolatile memory device and a plurality of connection pads including address signal pads and I/O pads in a peripheral portion at a main surface of the chip, said semiconductor memory device comprising:

at least one semiconductor memory cell array each having a plurality of nonvolatile memory cells arranged in rows and columns and a plurality of word line conductors and a plurality of data line conductors, each of said memory cells being connected with one word line conductor and one data line conductor, address signal pads for relatively higher order digits and those for relatively lower order digits being substantially arranged near one and the other of a first pair of opposing outer peripheral edges of the rectangular chip which are directioned substantially parallel with said word line conductors, respectively, each of said memory cells including a field-effect transistor element having a first gate electrode, a second gate electrode and first and second semiconductor regions formed in said chip, said second gate electrode being interposed between said first gate electrode and that part of the main surface of said chip, associated with each said field-effect transistor element, which lies between said first and second semiconductor regions, said word line conductors being formed at the main surface of said chip and extended in a first direction substantially parallel with said rows, the first gate electrodes of field-effect transistor elements of memory cells on one row being connected in common with a respective one of said word line conductors, said data line conductors being formed at the main surface of said chip and extended in a second direction substantially parallel with said columns, the first semiconductor regions of field-effect transistor elements of memory cells on one column being connected in common with a respective one of said data line conductors, and erasure line conductors being formed at the main surface of said chip and extended in said first direction so as to be substantially parallel with said rows, wherein each array of said at least one semiconductor memory cell array includes a plurality of memory blocks, each memory block being comprised of plural rows of memory cells in which the second semiconductor regions of the field-effect transistor elements thereof are connected in common with a same one of said erasure line conductors, said erasure line conductors corresponding, respectively, to different ones of said memory blocks;

a row address decoder, for electrical connection with said address signal pads for relatively higher order digits, covering a first plan view area of the main surface of the chip, adjacent a first end side which is directioned substantially parallel with said data line conductors, of a second plan view area which is for said semiconductor memory cell array;

a column address decoder, covering a third plan view area of the main surface of said chip in the vicinity of said semiconductor memory cell array and near that outer peripheral edge of said chip where said address signal pads for lower order digits are arranged for electrical connection therewith;

erasure means, covering a fourth plan view area of the main surface of said chip adjacent a second end side of said second plan view area, for said semiconductor memory cell array, which second end side is opposite the first end side thereof and which is directioned substantially parallel with said data line conductors, provided for electrical connection with at least a portion of said address signal pads for relatively higher order digits for selectively applying an information erasure signal to said semiconductor memory cell array, wherein said erasure means selectively applies an information erasure signal to said erasure line conductors, independently of said row address decoder, in which simultaneous erasure is effected of the memory cells within a selected memory block and said data line conductors are kept from being supplied with a power potential in an erase mode; and sense amplifier means, covering a fifth plan view area of the main surface of said chip adjacent that one of third and fourth opposite end sides of said second plan view area for said semiconductor memory cell array, which is directioned substantially parallel with said word line conductors, near that outer peripheral edge of said chip where said I/O pads are arranged for electrical connection therewith.

6. An electrically erasable semiconductor nonvolatile memory device according to claim 4, wherein said memory cell array includes a plurality of memory blocks, each memory block is comprised of plural rows of memory cells in which the source regions of the field-effect transistor elements thereof are connected in common with a same one of said third conductors, said third conductors corresponding, respectively, to different ones of said memory blocks.

7. An electrically erasable semiconductor nonvolatile memory device according to claim 3, wherein said memory cell array includes a plurality of memory blocks, each memory block is comprised of plural rows of memory cells in which the source regions of the field-effect transistor elements thereof are connected in common with a same one of said third conductors, said third conductors correspond, respectively, to different ones of said memory blocks.

8. An electrically erasable semiconductor nonvolatile memory device according to claim 5, wherein said pair of opposing outer peripheral edges of said rectangular semiconductor chip correspond to the pair of relatively longer peripheral edges thereof.

9. An electrically erasable semiconductor nonvolatile memory device comprising:

a plurality of nonvolatile memory cells formed in a semiconductor substrate and arranged in an array of rows and columns, each of said memory cells including a field-effect transistor element having a floating gate, a control gate and first and second semiconductor regions;

word line conductors extending in a first direction substantially parallel with said rows;

data line conductors extending in a second direction substantially parallel with said columns, the control gates and first semiconductor regions of said memory cells being connected with said word line and data line conductors, respectively, to form said array, said array of nonvolatile memory cells consisting of a plurality of memory blocks, wherein each of said memory blocks includes at least one word line conductor and the memory cells connected thereto and a common conductor connected to the second semiconductor regions of the field-effect transistor elements of the memory cells in said each memory block and extending in said first direction substantially parallel with said word line conductors, each common conductor belonging to a respective one of said memory blocks and serving, in an erasing operation, as a path for electrons to be extracted from the floating gates of the field-effect transistor elements of the memory cells in the memory block with which the common conductor corresponds to, and each word line conductor belonging to a respective one of said memory blocks; and an erasure signal generator coupled to the common conductors, wherein said erasure signal generator is responsive to an externally supplied address signal to generate an erasure signal to be selectively applied to at least one of the common conductors, independently of selection signals supplied to said word line conductors, and wherein simultaneous erasure of memory cells connected to said at least one word line in a selected memory block is effected by providing a potential difference between that of said common conductor, supplied with the erasure signal, and each word line conductor, supplied with a predetermined voltage, corresponding to that memory block and keeping said data line conductors from being supplied with a power potential, in an erase mode.

10. An electrically erasable semiconductor nonvolatile memory device comprising:

a semiconductor substrate having a main surface;

a memory cell array having a plurality of nonvolatile memory cells arranged in rows and columns, each of said memory cells including a field-effect transistor element having a first gate electrode, first and second semiconductor regions formed at the main surface of said semiconductor substrate and a second gate electrode, said second gate electrode being interposed between said first gate electrode and that part of the main surface of said semiconductor substrate, associated with each said field-effect transistor element, which lies between said first and second semiconductor regions;

decoder circuit means for controlling said first gate electrode of the field-effect transistors of said memory cells;

first conductors formed over said semiconductor substrate and extended in a first direction substantially parallel with said rows, the first gate electrodes of field-effect transistor elements of memory cells on one row being connected in common with a respective one of said first conductors;

second conductors formed over said semiconductor substrate and extended in a second direction substantially parallel with said columns, the first semiconductor regions of field-effect transistor elements of memory cells on one column being connected in common with a respective one of said second conductors;

third conductors formed over the main surface of said semiconductor substrate and extended in said first direction so as to be substantially parallel with said rows, the second semiconductor regions of at least one row of field-effect transistor elements of memory cells being connected in common with a same one of said third conductors, each third conductor corresponding to a respectively different set of memory cells in which each set includes one or more rows of memory cells; and means for selectively applying to said third conductors an information erasure signal, independently of said decoder circuit means, in response to an externally supplied address signal, in which simultaneous erasure of memory cells in a selected set is effected and said second conductors are kept from supplying a power potential to the first semiconductor regions of the field-effect transistor elements of the memory cells of said memory cell array in an erase mode.

11. A substantially rectangular semiconductor chip having an electrically erasable semiconductor nonvolatile memory device and a plurality of connection pads including address signal pads and I/O pads in a peripheral portion at a main surface of the chip, said semiconductor memory device comprising:

at least one semiconductor memory cell array each having a plurality of nonvolatile memory cells arranged in rows and columns and a plurality of word line conductors and a plurality of data line conductors, each of said memory cells being connected with one word line conductor and one data line conductor, address signal pads for relatively higher order digits and those for relatively lower order digits being substantially arranged near one and the other of a first pair of opposing outer peripheral edges of the rectangular chip which are directioned substantially parallel with said word line conductors, respectively, each of said memory cells including a field-effect transistor element having a first gate electrode, a second gate electrode and drain and source regions formed in said chip, said second gate electrode being interposed between said first gate electrode and that part of the main surface of said chip, associated with each said field-effect transistor, which lies between said drain and source regions, said word line conductors being formed at the main surface of said chip and extended in a first direction substantially parallel with said rows, the first gate electrodes of field-effect transistor elements of memory cells on one row being connected in common with a respective one of said word line conductors, said data line conductors being formed at the main surface of said chip and extended in a second direction substantially parallel with said columns, the drain regions of field-effect transistor elements of memory cells on one column being connected in common with a respective one of said data line conductors, and erasure line conductors being formed at the main surface of said chip and extended in said first direction so as to be substantially parallel with said rows, the source regions of at least one row of field-effect transistor elements of memory cells being connected in common with a same one of said erasure line conductors, each erasure line conductor corresponding to a respectively different set of memory cells in which each set consists of one or more rows of memory cells;

a row address decoder, for electrical connection with said address signal pads for relatively higher order digits, covering a first plan view area of the main surface of the chip, adjacent a first end side which is directioned substantially parallel with said data line conductors, of a second plan view area which is for said semiconductor memory cell array;

a column address decoder, covering a third plan view area of the main surface of said chip in the vicinity of said semiconductor memory cell array and near that outer peripheral edge of said chip where said address signal pads for lower order digits are arranged for electrical connection therewith;

erasure means, covering a fourth plan view area of the main surface of said chip adjacent a second end side of said second plan view area, for said semiconductor memory cell array, which second end side is opposite the first end side thereof and which is directioned substantially parallel with said data line conductors, provided for electrical connection with at least a portion of said address signal pads for relatively higher order digits for selectively applying an information erasure signal to said semiconductor memory cell array, wherein said erasure means selectively applies an information erasure signal to said erasure line conductors, independently of said row address decoder, in response to an externally supplied address signal, in which simultaneous erasure of memory cells in a selected set is effected and said data line conductors are kept from supplying a power potential to the drain regions of the field-effect transistor elements of memory cells of said at least one semiconductor memory cell array in an erase mode; and sense amplifier means, covering a fifth plan view area of the main surface of said chip adjacent that one of third and fourth opposite end sides of said second plan view area, for said semiconductor memory cell array, which is directioned substantially parallel with said word line conductors, near that outer peripheral edge of said chip where said I/O pads are arranged for electrical connection therewith.

12. An electrically erasable semiconductor nonvolatile memory device comprising:

a memory array comprised of at least one memory cell array, each memory cell array including a plurality of memory cell blocks, each memory cell block including at least one column of nonvolatile memory cells, and each of said memory cells including a field-effect transistor element having a first gate electrode, first and second semiconductor regions, formed at a main surface of a semiconductor substrate, and a second gate electrode, said second gate electrode being interposed between said first gate electrode and that part of the main surface of said semiconductor substrate, associated with each said field-effect transistor element, which lies between said first and second semiconductor regions;

first decoder circuit means for controlling said first gate electrodes of the field-effect transistors of said memory cells;

first conductors formed over said semiconductor substrate and extended in a first direction corresponding to a row direction, the first gate electrodes of field-effect transistor elements of memory cells on one row being connected in common with a respective one of said first conductors;

second conductors formed over said semiconductor substrate and extended in a second direction corresponding to a column direction, the first semiconductor regions of the field-effect transistor elements of memory cells on one column being connected in common with a respective one of said second conductors; and means selectively electrically connected, via said second conductors, with said at least one memory cell array for respectively supplying in an erase mode, independently of said decoder circuit means, information erasure voltages to at least a part of at least one of said memory cell blocks with relative time delays between said information erasure voltages, wherein said information erasure voltages are of a higher amplitude than voltages applied to the first gate electrodes of field-effect transistor elements in said at least part of said at least one memory cell block to be erased, and wherein the second semiconductor regions of field-effect transistor elements of the memory cells of said at least one memory cell array are continuously supplied with a same reference potential in the erase mode, and read and write modes of operation of said device.

13. An electrically erasable semiconductor nonvolatile memory device according to claim 12, wherein said reference potential is ground voltage.

14. An electrically erasable semiconductor nonvolatile memory device according to claim 12, wherein said second conductors are data line conductors, and said first and second semiconductor regions are drain and source regions, respectively.

15. An electrically erasable semiconductor nonvolatile memory device according to claim 14, further comprising:

second decoder circuit means for controllably accessing the data line conductors of said at least one memory cell array.

16. An electrically erasable semiconductor nonvolatile memory device according to claim 15, wherein said second decoder circuit means includes a column decoder and a field-effect transistor switching circuit coupled thereto, said field-effect transistor switching circuit being coupled to supply an information erasure voltage to each of selected ones of data line conductors in each of said memory cell blocks which are to be erased in succession, in said erase mode, and being coupled to provide for selective accessing of individual data lines of said at least one memory cell block in both said read and write modes.

17. An electrically erasable semiconductor nonvolatile memory device according to claim 16, wherein the information erasure voltage supplying means includes a control circuit for producing an erasure control signal, delay circuit means and a plurality of information erasure voltage signal generating circuits in which one is provided for each of said memory cell blocks, said erasure control signal is supplied to a first one of said plurality of information erasure voltage signal generating circuits and to said delay means, remaining ones of said plurality of information erasure voltage signal generating circuits are responsive to outputs of said delay means for generating delayed information erasure voltage signals, and information erasure voltage signals from said plurality of erasure voltage signal generating circuits are supplied to a selected one or more of the data line conductors of each of said memory cell blocks via said field-effect transistor switching circuit.

18. An electrically erasable semiconductor nonvolatile memory device comprising:

a plurality of memory blocks each including a plurality of memory cells arranged in rows and columns, each of said memory cells including a field-effect transistor (FET) element having a floating gate, a control gate and drain and source regions in which electric current flows between said drain and source regions of the FET element when the FET element is conductive, said memory blocks being arrayed in a direction parallel with a column direction;

word lines each extending in a row direction, perpendicular to the direction of arraying of said memory blocks, and connected to the control electrodes of the FET elements of memory cells on one row, each of said memory blocks including at least one row of memory cells and at least one word line, said at least one word line of a memory block belonging to that memory block;

data lines each of which is extended in a column direction and is electrically connected to the drain region of the FET elements of memory cells in a corresponding column;

common source lines one provided for each of said memory blocks, the common source line in each memory block being connected in common with the source regions of the FET elements of memory cells included in that memory block;

a decoder circuit responsive to an externally applied address signal for providing a predetermined voltage to the word lines included in a memory block selected among said plurality of memory blocks by the address signal; and an information erasure signal generating circuit responsive to said externally applied address signal for supplying an information erasure signal to the common source line included in the selected memory block, wherein the memory cells included in said selected memory block are simultaneously erased by providing a potential difference between said predetermined voltage on the word lines, provided by said decoder circuit, and a voltage of said information erasure signal, said information erasure signal being supplied to said common source line of the selected memory block independently of said decoder circuit, and the drain regions of the FET elements of the memory cells of the selected memory block are not supplied with a power potential in an erase mode.

19. An electrically erasable semiconductor nonvolatile memory device according to claim 18, wherein said memory blocks are arranged, at a main surface of a chip substrate, between said decoder circuit and said information erasure signal generating circuit.

* * * * *